(12) United States Patent
Shim et al.

(10) Patent No.: US 10,901,566 B2
(45) Date of Patent: Jan. 26, 2021

(54) ELECTRONIC DEVICE

(71) Applicant: SAMSUNG DISPLAY CO., LTD., Yongin-si (KR)

(72) Inventors: Jinbo Shim, Yongin-si (KR); Kyungseop Kim, Hwaseong-si (KR); Sungkyun Park, Hwaseong-si (KR); Wonsuk Choi, Seoul (KR); Jaewon Choi, Hwaseong-si (KR); Jung-Moo Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/521,234

(22) Filed: Jul. 24, 2019

(65) Prior Publication Data
US 2020/0089368 A1    Mar. 19, 2020

(30) Foreign Application Priority Data

Sep. 18, 2018  (KR) ........................ 10-2018-0111326

(51) Int. Cl.
| | |
|---|---|
| *G06F 3/044* | (2006.01) |
| *G06F 3/041* | (2006.01) |
| *H01L 27/32* | (2006.01) |
| *H01L 51/00* | (2006.01) |
| *H01L 51/52* | (2006.01) |
| *H01L 51/56* | (2006.01) |

(52) U.S. Cl.
CPC .......... *G06F 3/0445* (2019.05); *G06F 3/0412* (2013.01); *H01L 27/323* (2013.01); *H01L 27/3276* (2013.01); *H01L 51/0097* (2013.01); *H01L 51/5253* (2013.01); *H01L 51/56* (2013.01); *G06F 3/0446* (2019.05); *G06F 2203/04112* (2013.01); *H01L 2227/323* (2013.01)

(58) Field of Classification Search
CPC ......... G06F 3/044; G06F 3/041; H01L 27/32; H01L 51/52; H01L 51/00; H01L 51/56
See application file for complete search history.

(56) References Cited

U.S. PATENT DOCUMENTS

| | | | | |
|---|---|---|---|---|
| 9,276,055 | B1* | 3/2016 | Son ....................... H01L 27/323 |
| 9,287,329 | B1* | 3/2016 | Lee ..................... H01L 51/5262 |
| 10,211,276 | B2* | 2/2019 | Choi ................... H01L 51/0097 |
| 10,243,030 | B2* | 3/2019 | Wu ..................... H01L 25/0753 |
| 10,609,821 | B2* | 3/2020 | Jeon ....................... H01L 33/44 |
| 10,672,755 | B2* | 6/2020 | Wu ..................... H01L 27/1251 |
| 10,707,429 | B2* | 7/2020 | Jin ..................... H01L 51/0097 |
| 2016/0035759 | A1* | 2/2016 | Kwon ................. H01L 51/0097 257/40 |

(Continued)

FOREIGN PATENT DOCUMENTS

| | | |
|---|---|---|
| KR | 10-2017-0080203 | 7/2017 |
| KR | 10-2018-0015326 | 2/2018 |
| KR | 10-2018-0036853 | 4/2018 |

*Primary Examiner* — Vinh T Lam
(74) *Attorney, Agent, or Firm* — F. Chau & Associates, LLC

(57) ABSTRACT

An electronic device includes an organic layer disposed in a bendable region and a connection wiring disposed on the organic layer. The connection wiring is connected to the signal lines connected to pixels of a display unit. The organic layer and the connection wiring in the bendable region include the same materials as those in an input sensing unit.

20 Claims, 15 Drawing Sheets

(56) References Cited

U.S. PATENT DOCUMENTS

| | | | |
|---|---|---|---|
| 2016/0035812 A1* | 2/2016 | Kwon | H01L 29/66757 |
| | | | 257/40 |
| 2016/0093644 A1* | 3/2016 | Ki | H01L 27/1222 |
| | | | 257/40 |
| 2016/0179229 A1* | 6/2016 | Ahn | G06F 3/044 |
| | | | 345/173 |
| 2017/0077147 A1* | 3/2017 | Kwon | G02F 1/13454 |
| 2017/0192572 A1* | 7/2017 | Han | G06F 3/0443 |
| 2017/0237025 A1* | 8/2017 | Choi | H01L 51/56 |
| | | | 257/40 |
| 2017/0262109 A1* | 9/2017 | Choi | H01L 51/56 |
| 2017/0271616 A1* | 9/2017 | Choi | H01L 51/529 |
| 2017/0294425 A1* | 10/2017 | Kim | H01L 51/0097 |
| 2018/0033919 A1* | 2/2018 | Lee | F21V 33/00 |
| 2018/0040672 A1 | 2/2018 | Park et al. | |
| 2018/0053906 A1* | 2/2018 | Lee | H01L 27/3276 |
| 2018/0090701 A1* | 3/2018 | Senda | H01L 51/0097 |
| 2018/0090702 A1* | 3/2018 | Um | H01L 51/0097 |
| 2018/0113545 A1 | 4/2018 | Shim et al. | |
| 2018/0151662 A1* | 5/2018 | Rhe | H01L 51/0097 |
| 2018/0166652 A1* | 6/2018 | Kim | B32B 3/30 |
| 2018/0314098 A1* | 11/2018 | Saitoh | G02F 1/133512 |
| 2018/0342700 A1* | 11/2018 | Cai | H01L 51/5256 |
| 2018/0366586 A1* | 12/2018 | Son | H01L 27/3276 |

* cited by examiner

ELECTRONIC DEVICE

CROSS-REFERENCE TO RELATED APPLICATIONS

This U.S. non-provisional patent application claims priority under 35 U.S.C. § 119 from, and the benefit of, Korean Patent Application No. 10-2018-0111326, filed on Sep. 18, 2018 in the Korean Intellectual Property Office, the contents of which are herein incorporated by reference in their entirety.

BACKGROUND

Embodiments of the present disclosure are directed to an electronic device, and more particularly, to an electronic device with improved reliability.

Electronic devices are activated by an electrical signal. Electronic devices are composed of various electronic components, such as a display unit for displaying an image, or an input sensing unit for detecting an external input. Electronic components are electrically interconnected by variously arranged signal lines.

A variety of signal lines may be provided depending on the number of electronic components or the processing environment, and are designed to be bent and arranged in a proper configuration that can prevent electrical signal interference within a predetermined panel area.

SUMMARY

Embodiment of the present disclosure can reduce the processing cost and time of an input sensing unit by forming organic layers and signal lines in a bendable region in a same process as the structures included in the input sensing unit.

An embodiment of the inventive concept provides an electronic device, including: a base substrate that includes a bendable region capable of being bent about a bending axis that extends along one direction and a non-bendable region adjacent to the bendable region; a display unit disposed on the base substrate and that includes a circuit element layer that includes a thin film transistor and a plurality of insulating layers, a display element layer that includes an organic light emitting element connected to the thin film transistor, a sealing layer that covers the display element layer, and a groove formed through some of the insulating layers in the bendable region that exposes a part of the base substrate in the bendable region; an input sensing unit disposed on the sealing layer and that includes a first detection insulating layer, a first detection electrode and a second detection electrode spaced apart from each other with the first detection insulating layer therebetween, and a second detection insulating layer that covers the first detection insulating layer; a first organic layer that covers a part of the exposed base substrate and the groove; a connection wiring disposed on the first organic layer and connected to at least one of the display unit and the input sensing unit and that includes a same material as at least one of the first and second detection electrodes; and a second organic layer that covers the connection wiring. The first organic layer and the connection wiring overlap each other in the bendable region.

In an embodiment, the first organic layer may include a same material as the first detection insulating layer.

In an embodiment, the second organic layer may include a same material as the second detection insulating layer.

In an embodiment, the first organic layer may include a same material as any one of the insulating layers.

In an embodiment, the second organic layer may include a same material as the first detection insulating layer.

In an embodiment, the electronic device may further include an additional organic layer disposed between the first organic layer and the second organic layer that includes a same material as the first detection insulating layer, and the second organic layer may include a same material as the second detection insulating layer.

In an embodiment, the connection wiring may include a first wiring disposed between the first organic layer and the additional organic layer, and a second wiring disposed between the additional organic layer and the second organic layer. The second wiring may be connected to the first wiring through a contact hole that penetrates the additional organic layer.

In an embodiment, the connection wiring may be disposed between the first organic layer and the second organic layer.

In an embodiment, the thin film transistor may include a semiconductor pattern, a control electrode spaced apart from the semiconductor pattern, an upper electrode spaced apart from the control electrode, an input electrode connected to the semiconductor pattern, and an output electrode disposed on the same layer as the input electrode and connected to the semiconductor pattern. The semiconductor pattern may include at least one of an oxide semiconductor pattern or a silicon semiconductor pattern.

In an embodiment, the insulating layers may include: at least one inorganic layer disposed between the base substrate and the semiconductor pattern; a first insulating layer that covers the semiconductor pattern; a second insulating layer that covers the control electrode and the first insulating layer; a third insulating layer that covers the upper electrode and the second insulating layer; and a fourth insulating layer that covers the third insulating layer, the input electrode, and the output electrode. The first organic layer may include a same material as the fourth insulating layer.

In an embodiment, the electronic device may further include a pad area in the bendable region that includes a pad exposed by some of the insulating layers that overlap the bendable region. The pad may be connected to the connection wiring.

In an embodiment, the electronic device may further include a circuit board connected to the pad.

In an embodiment of the inventive concept, an electronic device includes: a base substrate that includes a bendable region capable of being bent about a bending axis that extends along one direction and a non-bendable region adjacent to the bendable region; a display unit that includes a pixel disposed on the base substrate and that includes a thin film transistor, an organic light emitting element connected to the thin film transistor, and a plurality of insulating layers; an input sensing unit disposed on the pixel and that includes a first detection insulating layer, a first detection electrode and a second detection electrode spaced apart from each other with the first detection insulating layer therebetween, and a second detection insulating layer that covers the first detection insulating layer; a groove formed through the insulating layers in the bendable region that exposes a part of the base substrate in the bendable region and that extends along the bending axis; a first organic layer that covers a part of the exposed base substrate and the groove; a connection wiring connected to the pixel through the bendable region; and a second organic layer that covers the connection wiring. The second organic layer includes a same material as the second detection insulating layer.

In an embodiment, the connection wiring may include a same material as at least one of the first and second detection electrodes.

In an embodiment, the first organic layer may include a same material as the first detection insulating layer.

In an embodiment, the connection wiring may be disposed on the first organic layer.

In an embodiment, the first organic layer may include a same material as at least one of the insulating layers.

In an embodiment, the electronic device may further include an additional organic layer disposed between the first organic layer and the second organic layer and that includes a same material as the first detection insulating layer. The connection wiring may include a first wiring disposed between the first organic layer and the additional organic layer and a second wiring disposed between the additional organic layer and the second organic layer. The second wiring may be connected to the first wiring through a contact hole that penetrates the additional organic layer.

In an embodiment, the first wiring may include a same material as the first detection electrode and the second wiring includes a same material as the second detection electrode.

In an embodiment of the inventive concept, a method of manufacturing an electronic device includes: forming, through a deposition process, a preliminary display unit that includes a base substrate that includes a bendable region capable of being bent about a bending axis that extends along one direction and a non-bendable region adjacent to the bendable region, a thin film transistor on the base substrate, an organic light emitting device connected to the thin film transistor, a sealing layer that covers the organic light emitting device, and a plurality of insulating layers; forming a groove by removing a part of each of the insulating layers to expose a part of the base substrate that overlaps the bendable region; forming a first detection electrode by forming a first conductive layer on the sealing layer and then, patterning the first conductive layer; forming a preliminary organic layer that covers the first detection electrode, a part of the exposed base substrate, and the groove; forming a first detection insulating layer that covers the first detection electrode and a first organic layer that covers a part of the exposed portion of the base substrate and the groove by patterning the preliminary organic layer; forming a second detection electrode and a connection wiring by forming a second conductive layer on the first detection insulating layer and the bendable region and patterning the second conductive layer; and forming a second organic layer that covers the second detection electrode and the connection wiring.

DETAILED DESCRIPTION

Figure 1A:
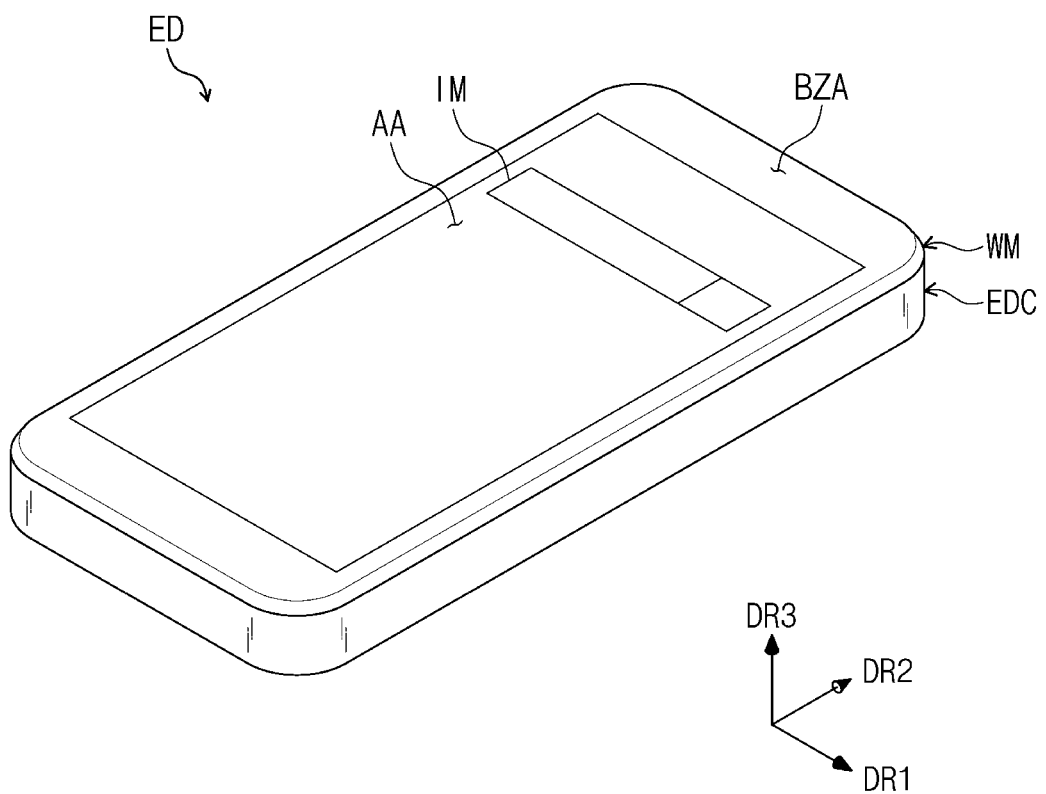
FIG. 1A is an assembled perspective view of an electronic device according to an embodiment of the inventive concept.

In this specification, when it is mentioned that a component, or, an area, a layer, a part, etc., is referred to as being "on", "connected to" or "combined to" another component, this means that the component may be directly on, connected to, or combined to the other component or a third component therebetween may be present.

Like reference numerals may refer to like elements. Additionally, in the drawings, the thicknesses, proportions, and dimensions of components may be exaggerated for effective description.

Figure 1B:
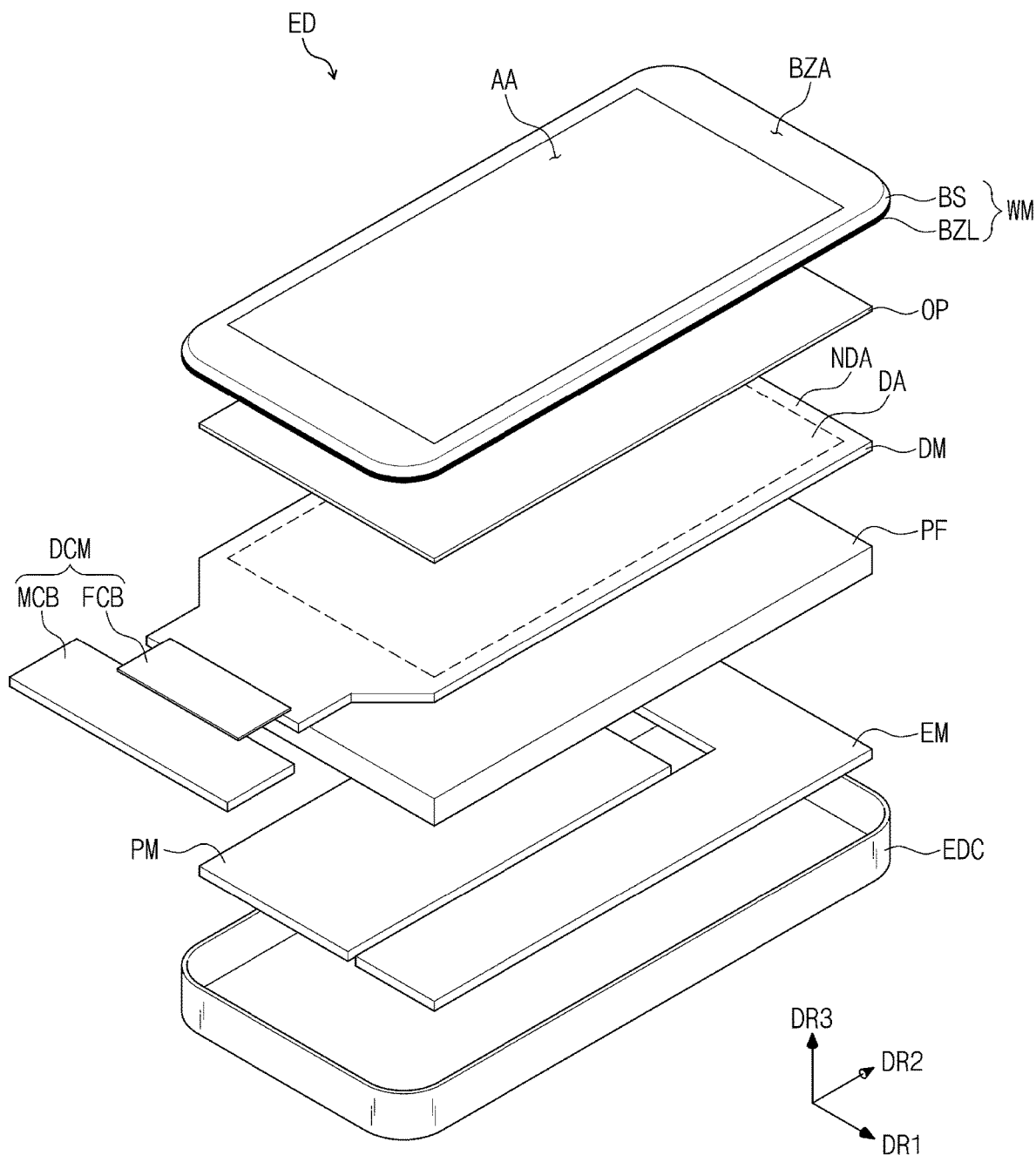
FIG. 1B is an exploded perspective view of an electronic device shown in FIG. 1A.
Figure 2A:
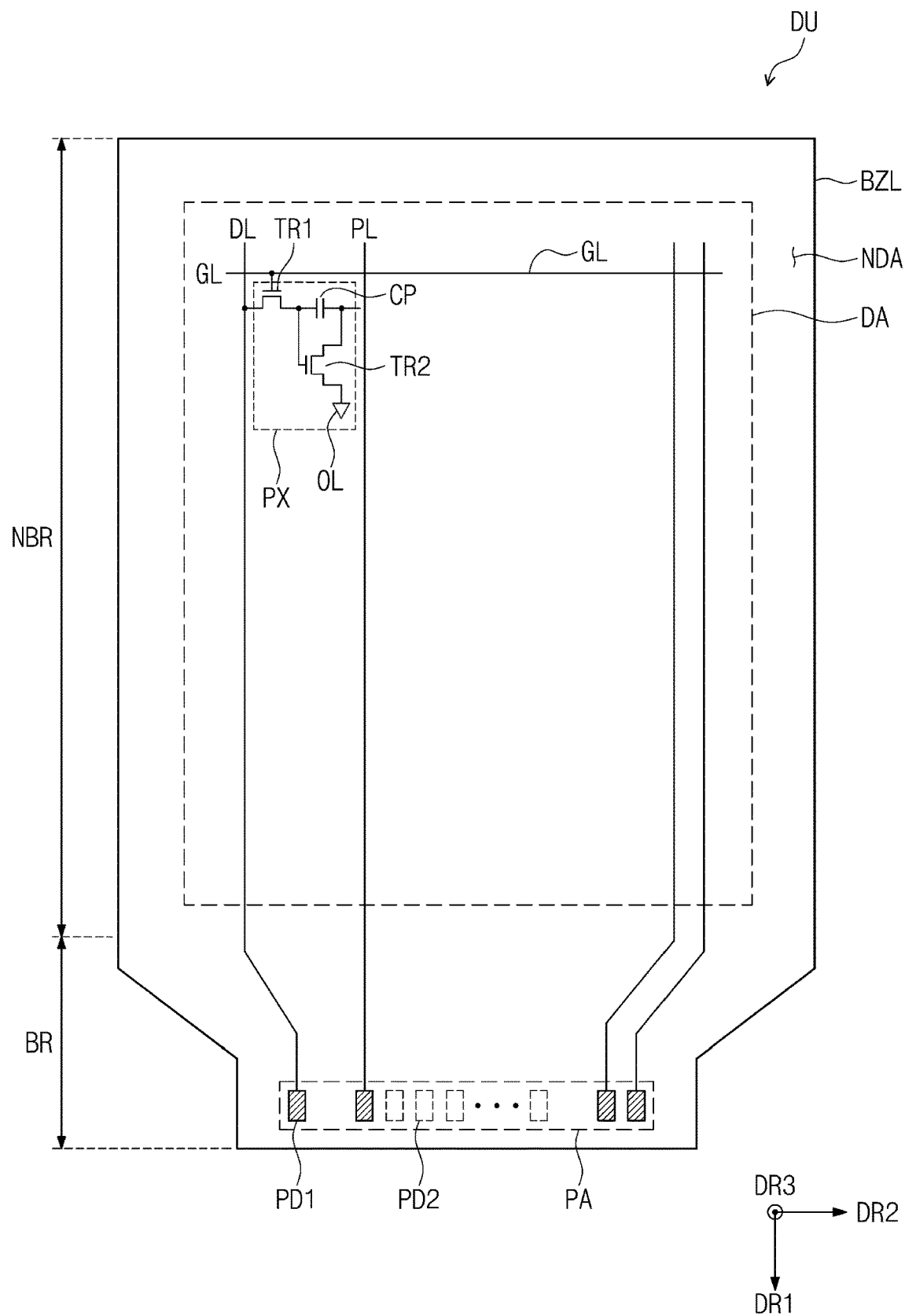
FIG. 2A is a plan view of a display unit according to an embodiment of the inventive concept.
Figure 2B:
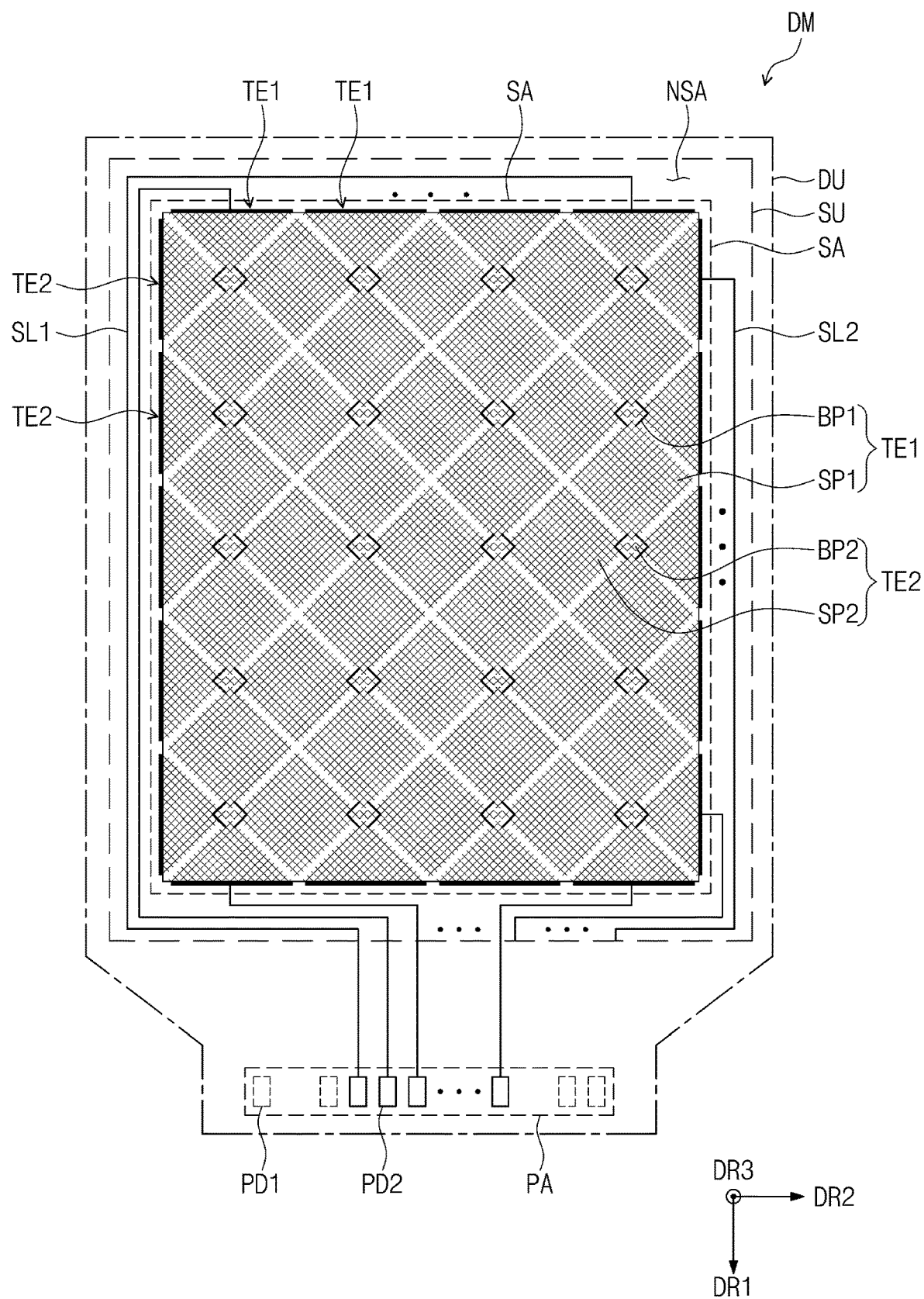
FIG. 2B is a plan view of an input sensing unit according to an embodiment of the inventive concept.
Figure 3:
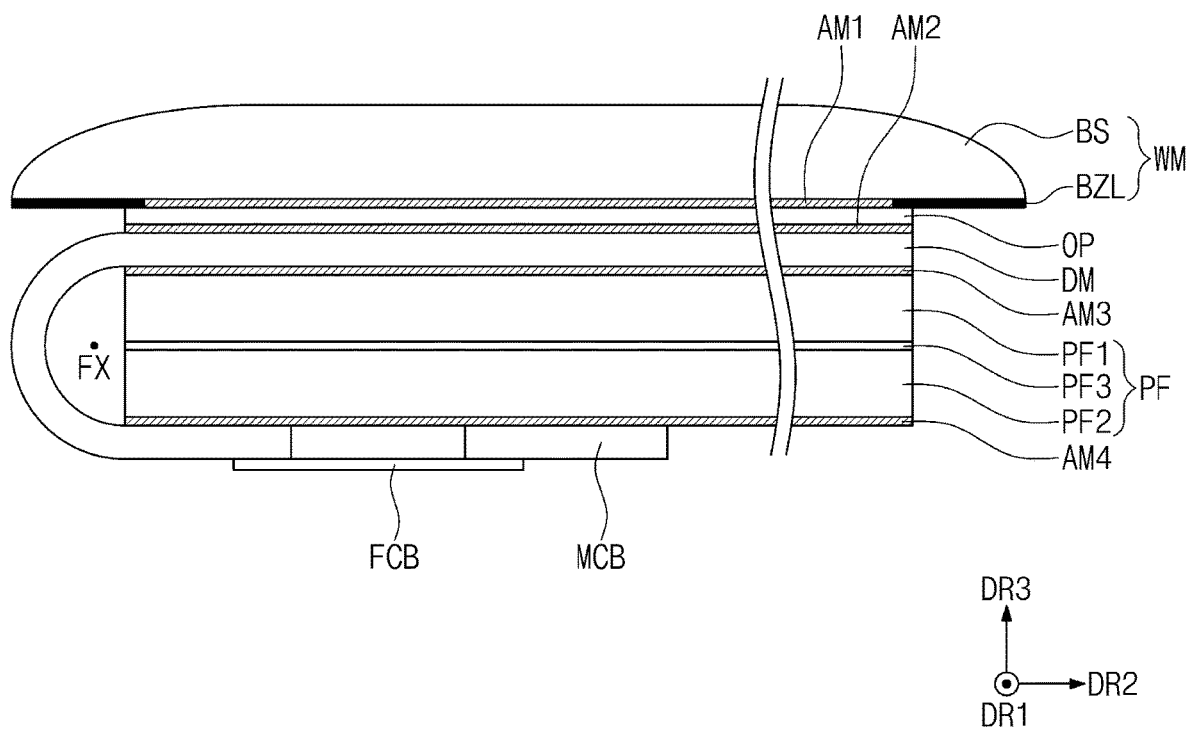
FIG. 3 is a cross-sectional view of an electronic device shown in FIG. 1A.
Figure 4:
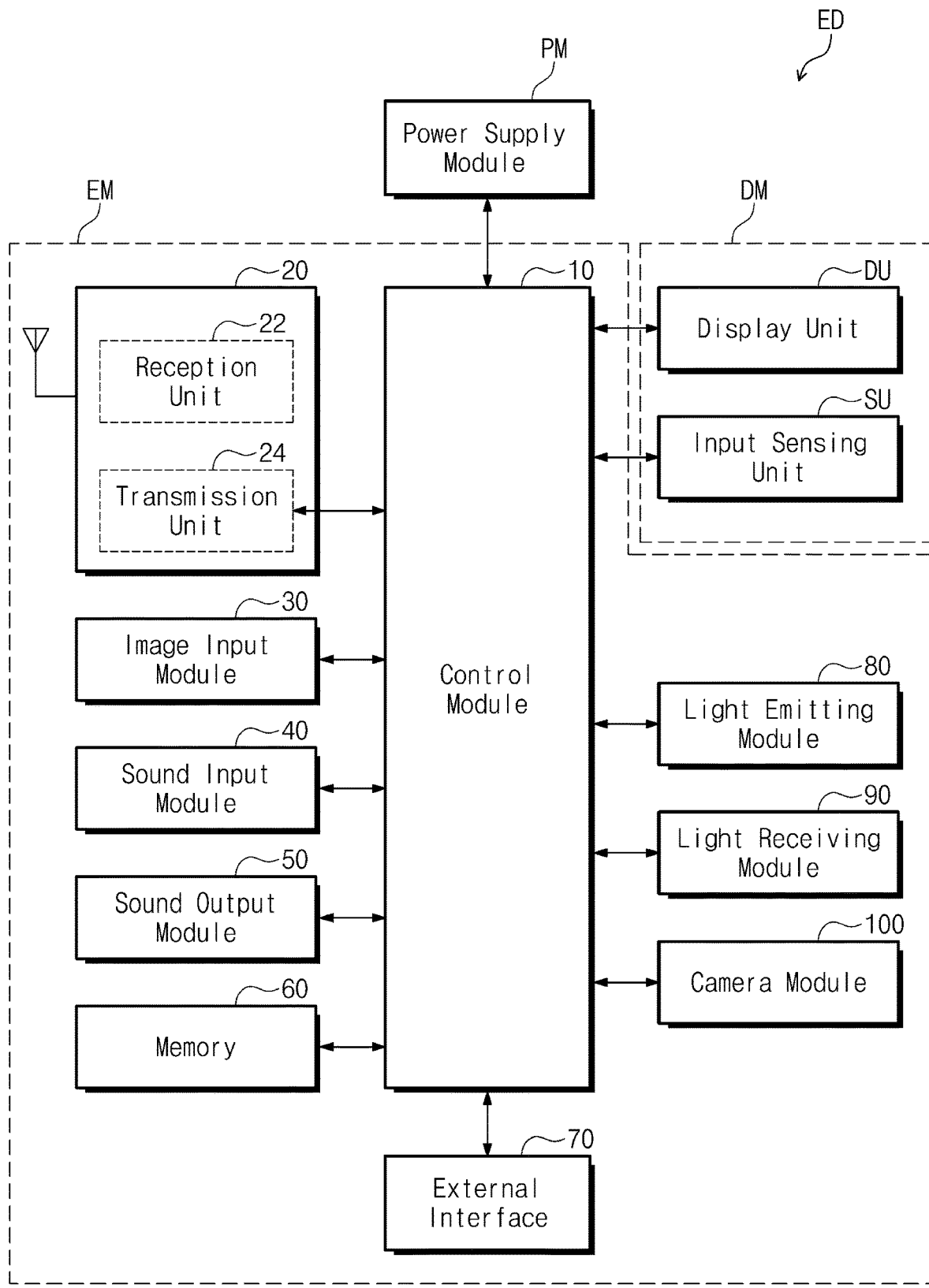
FIG. 4 is a block diagram of an electronic device shown in FIG. 1A.

FIG. 1A is an assembled perspective view of an electronic device according to an embodiment of the inventive concept. FIG. 1B is an exploded perspective view of an electronic device shown in FIG. 1A. FIG. 2A is a plan view of a display unit according to an embodiment of the inventive concept. FIG. 2B is a plan view of a display unit according to an embodiment of the inventive concept. FIG. 3 is a cross-sectional view of an electronic device shown in FIG. 1A. FIG. 4 is a block diagram of an electronic device shown in FIG. 1A. Hereinafter, an electronic device according to an embodiment of the inventive concept will be described with reference to FIGS. 1A to 4.

An electronic device ED is a device that is activated in response to an electrical signal. The electronic device ED includes various embodiments. For example, the electronic device ED may be a tablet, a notebook, a computer, a smart television, etc. In an embodiment, a smart phone is illustrated as an example of an electronic device ED.

Referring to FIGS. 1A and 1B, according to an embodiment, a display surface on which an image IM is displayed is parallel to a plane defined by a first direction DR1 and a second direction DR2. The display surface includes an active area AA and a bezel area BZA adjacent to the active area AA.

According to an embodiment, the active area AA displays the image IM. An Internet search window is shown as an example of the image IM in FIG. 1A. The active area AA has a rectangular shape. However, this is illustrated by way of example, and the active area AA may have various other shapes and is not limited to any one embodiment.

According to an embodiment, the bezel area BZA is adjacent to the active area AA. The bezel area BZA surrounds the active area AA. However, this is illustrated by way of example, and the bezel area BZA may be disposed adjacent at only one, two or three sides of the active area AA, or may be omitted. An electronic device according to an embodiment of the inventive concept may be implemented according to various embodiments and is not limited to any one embodiment.

According to an embodiment, the normal direction of the display surface corresponds to a thickness direction DR3 of the electronic device ED, hereinafter referred to as a third direction. In a present embodiment, the front or upper surface and the rear or lower surface of each member are defined with reference to the direction in which the image IM is displayed. The front surface and the rear surface are opposite to each other in the third direction DR3.

Moreover, according to an embodiment, the directions indicated by the first to third directions DR1, DR2, and DR3 may be transformed to other directions in other embodiments.

According to an embodiment, the electronic device ED includes a window member WM, an antireflective member OP, a display module DM, a protective member PF, an electronic module EM, a power supply module PM, and an external case EDC. An exemplary configuration of the electronic device ED is shown in FIGS. 1A and 1B.

According to an embodiment, the window member WM includes a base member BS and a bezel layer BZL. The window member WM provides a front surface of the electronic device ED. An area where the bezel layer BZL is disposed is referred to as a bezel area BZA. Although the window member WM is shown as being flat in the active area AA in a present embodiment, this is an example, and the shape of the window member WM may be modified. For example, the window member WM may include at least one curved surface in the active area AA.

According to an embodiment, the base member BS may include a glass substrate, a sapphire substrate, a plastic film, etc. The base member BS may be multi-layered or have a single-layer structure. For example, the base member BS includes a plurality of plastic films bonded together with an adhesive. The base member BS includes a glass substrate and a plastic film bonded to the glass substrate with an adhesive.

According to an embodiment, the bezel layer BZL is disposed on the rear surface of the base member BS. The bezel layer BZL may have a single layer or a multilayer structure. The multi-layered bezel layer BZL includes a buffer layer that improves adhesion, a pattern layer that provides a predetermined pattern, and an achromatic layer. The bezel layer may be formed by vapor deposition, printing, coating, etc. On the other hand, this is an example, and the bezel layer BZL may be omitted in the window member WM according to an embodiment of the inventive concept.

According to an embodiment, the window member WM further includes a functional coating layer disposed at the front surface of the base member BS. The functional coating layer may include an anti-fingerprint layer, anti-reflective layer, or a hard coating layer.

According to an embodiment, the antireflective member OP includes a polarizing film or a phase retardation film. The polarizing film and the phase retardation film are conventional stretch-type films. In addition, an adhesive member disposed between the antireflective member OP and the display module DM is further included. Alternatively, the antireflective member OP may be omitted in the electronic device ED according to an embodiment of the inventive concept.

According to an embodiment, the display module DM creates an image in the window member WM. Further, the display module DM can detect an external input, e.g., a user's touch. The external input may be one of various types of inputs received by the electronic device ED. An externally applied input may have various forms. For example, the external input may be applied close to or spaced a predetermined distance from the electronic device ED, e.g., hovering, as well as be a contact from a part of the body, such as the user's hand. Further, the externally applied input may have various forms, such as force, pressure, or light, and is not limited to any one embodiment. The display module DM is electrically connected to the electronic module EM through a flexible circuit board.

According to an embodiment, the display module DM includes a display unit DU, an input sensing unit SU, and a driving control unit DCM. FIG. 1B shows the display module DM in an unfolded state.

FIG. 2A shows the display unit DU separate from the input sensing unit SU for convenience of explanation.

According to an embodiment, the display unit DU includes a display area DA and a non-display area NDA. The display unit DU generates and displays the image IM in the display area DA. The display area DA overlaps the active area AA. The non-display area NDA overlaps the bezel area BZA adjacent to the display area DA.

According to an embodiment, the display unit DU receives an electrical signal and displays the image IM in the display area DA. The display unit DU may have various forms. For example, the display unit DU may be an organic light emitting display panel, an electrophoretic display panel, an electrowetting display panel, or a liquid crystal display panel. In an embodiment, the display unit DU is an organic light emitting display panel.

According to an embodiment, the display unit DU includes a plurality of signal lines GL, DL, and PL, a plurality of pixels PX, and a plurality of pads PD, hereinafter referred to as pads. The display unit DU also includes a bendable region BR and a non-bendable region NBR. The display unit DU is flexible so as to be bendable.

According to an embodiment, the signal lines GL, DL, and PL include gate lines GL, data lines DL, and power lines PL. The gate lines GL, the data lines DL, and the power lines PL each transmit a different electrical signal.

According to an embodiment, the gate lines GL extend along the second direction DR2. Although a plurality of gate lines GL are provided and spaced apart from each other along the first direction DR1, a single gate line GL is shown for ease of explanation.

In addition, according to an embodiment, the display unit DU may further include a gate driving circuit that provides an electrical signal to the gate line GL. Alternatively, the display unit DU further includes gate pads that electrically connect to an externally provided gate driving circuit.

According to an embodiment, the data lines DL extend along the first direction DR1. The data lines DL are electrically insulated from the gate lines GL. Although a plurality of data lines DL are provided and spaced apart from each other along the second direction DR2, a single data line DL is shown for ease of explanation. The data line DL transmits a data signal to the pixel PX.

According to an embodiment, the power lines PL extend along the first direction DR1. The power lines PL are electrically insulated from the gate lines GL and the data lines DL. Although a plurality of power lines PL are provided and spaced apart from each other along the second direction DR2, a single power line PL is shown for ease of explanation. The power line PL provides a power signal, hereinafter referred to as a first power signal, to the pixel PX.

According to an embodiment, the pixels PX are disposed in the display area DA. Although a plurality of pixels PX are provided and arranged in a matrix form along the first direction DR1 and the second direction DR2 in the display area DA, a single pixel PX is shown for ease of explanation. The pixel PX displays an image IM by displaying light based on an electrical signal.

According to an embodiment, the pixel PX includes a first thin film transistor TR1, a second thin film transistor TR2, a capacitor CP, and an organic light emitting element OL. The first thin film transistor TR1, the second thin film transistor TR2, the capacitor CP, and the organic light emitting element OL are electrically connected.

According to an embodiment, the first thin film transistor TR1 is a switching element that controls the turn-on and turn-off of the pixel PX. The first thin film transistor TR1 is connected to the gate line GL and the data line DL. The first thin film transistor TR1 is turned on by a gate signal received from the gate line GL and transmits a data signal received from the data line DL to the capacitor CP.

According to an embodiment, the capacitor CP charges the voltage corresponding to the potential difference between the first power signal provided from the power line PL and the signal provided from the thin film transistor TR1. The second thin film transistor TR2 provides the organic light emitting element OL with a first power signal received from the power line PL in correspondence to the voltage charged in the capacitor CP.

According to an embodiment, the organic light emitting element OL generates light or controls an amount of light according to an electrical signal. The organic light emitting element OL may include an organic light emitting element, a quantum dot light emitting element, an electrophoretic element, or an electrowetting element.

According to an embodiment, the organic light emitting element OL is connected to a power supply terminal and receives a second power signal different from the first power signal. A driving current corresponding to a difference between an electrical signal received from the second thin film transistor TR2 and the second power signal flows through the organic light emitting element OL, and the organic light emitting element OL generates light corresponding to the driving current.

However, this is illustrated by way of example, and the pixel PX may include other electronic components having different configurations and arrangements, and is not limited to any one embodiment.

According to an embodiment, the first pad PD1 and the second pad PD2 are disposed in a non-display area NDA. An area in the non-display area NDA where the first pad PD1 and the second pad PD2 are disposed is referred to as a pad area PA. The pad area PA is a region to which a part of the driving control unit DCM is coupled. The driving control unit DCM is electrically connected to the display unit DU through the first pad PD1 disposed in the pad area PA and electrically connected to the input sensing unit SU through the second pad PD2. The connection relationship between the second pad PD2 and the input sensing unit SU will be described below.

According to an embodiment, the first pad PD1 includes data pads and power pads. The data pads are connected to the data lines DL. The data lines DL extend from the display area DA and are connected to the data pads. The data lines DL receive data signals from the data pads.

Referring to FIG. 2B, an input sensing unit SU according to an embodiment of the inventive concept is disposed directly on the display unit DU. The input sensing unit SU includes a plurality of first detection electrodes TE1, a plurality of second detection electrodes TE2, a plurality of first signal lines SL1, and a plurality of second signal lines SL2 disposed on plane. The input sensing unit SU includes a detection area SA that detects external inputs and a non-detection area NSA adjacent to the detection area SA. The detection area SA overlaps the active area AA. The non-detection area NSA overlaps the bezel area BZL.

According to an embodiment, the first detection electrodes TE1 extend along the first direction DR1. The plurality of first detection electrodes TE1 are arranged along the second direction DR2. The first detection electrodes TE1 includes a plurality of first sensor patterns SP1 arranged along the first direction DR1 and first connection patterns BP1 disposed between the first sensor patterns SP1 that connect adjacent first sensor patterns SP1.

According to an embodiment, the second detection electrodes TE2 are insulated from the first detection electrodes TE1. The second detection electrodes TE2 extend along the second direction DR2. The plurality of second detection electrodes TE2 are arranged along the first direction DR1. The second detection electrodes TE2 include a plurality of second sensor patterns SP2 arranged along the second direction DR2 and second connection patterns BP2 disposed between the second sensor patterns SP2 that connect adjacent second sensor patterns SP2.

According to an embodiment, the input sensing unit SU detects a change in mutual capacitance between the first detection electrode TE1 and the second detection electrode TE2, or detects an external input by detecting a change in self-capacitance of each of the first detection electrodes TE1 and the second detection electrodes TE2. The input sensing unit SU according to an embodiment of the inventive concept can detect an external input in various ways, and is not limited to any one embodiment.

According to an embodiment, the first signal lines SL1 are connected to the first detection electrodes TE1. The first signal lines SL1 are disposed in the non-detection area NSA and are not externally visible. The second signal lines SL2 are connected to the second detection electrodes TE2. The second signal line SL2 are disposed in the non-detection area NSA and are not externally visible.

In addition, in this embodiment, one first detection electrode TE1 is connected to two first signal lines SL1. The first signal lines SL1 are connected to both ends of the first detection electrodes TE1, and first signal lines SL1 connected opposite ends of one first detection electrode TE1 are connected to separated and independent pads, respectively. Accordingly, even though the first detection electrode TE1 is relatively long as compared to the second detection electrode TE2, an electrical signal can be uniformly applied to the entire region. Thus, the input sensing unit SU can provide a uniform external input detection environment for the entire detection area SA, regardless of shape.

However, this is an example. The second detection electrode TE2 may also be connected to the two second signal lines, or each of the first detection electrode TE1 and the second detection electrode TE2 may be connected to only one signal line. The input sensing unit SU according to an embodiment of the inventive concept can be driven in various ways, and is not limited to any one embodiment.

According to an embodiment, the first signal lines SL1 and the second signal lines SL2 are connected to the second pads PD2 disposed in the pad area PA.

Referring again to FIG. 1B, according to an embodiment, the driving control unit DCM includes a main circuit board MCB, hereinafter referred to as a first circuit board, and a flexible circuit board FCB, hereinafter referred to as a second circuit board, that connects the first circuit board MCB and the display unit DU.

According to an embodiment, the first circuit board MCB further includes a plurality of electronic components mounted thereon. Electronic components are electrically connected through circuit wirings. The first circuit board MCB is electrically connected to the second circuit board FCB, the display unit DU, and the input sensing unit SU.

In addition, according to an embodiment, the first circuit board MCB further includes a protective cap that covers the electronic components. The protective cap is a metal protective cover and is coupled to the first circuit board MCB through soldering. The first circuit board MCB is electrically connected to the mother board of the electronic module EM through a connector.

According to an embodiment, the second circuit board FCB includes a flexible film and plurality of circuit wirings arranged in the flexible film. The circuit wirings electrically connect the first circuit board MCB to the display unit DU and the first circuit board MCB to the input sensing unit SU. One side of the second circuit board FCB is disposed overlapping the pad area PA in the bendable region BR of the display unit DU. Pads exposed on the rear surface of the second circuit board FCB are connected in correspondence with the pads PD1.

According to an embodiment, the second circuit board FCB further includes a driving element disposed thereon. The driving element is connected to at least a part of the circuit wirings of the second circuit board FCB and is electrically connected to the display unit DU. The driving element can transmit or receive various driving signals to or from the display unit DU. The driving element is a chip mounted in the form of a chip on film (COF) on a second circuit board FCB. The driving element includes driving elements that drive the pixel PX.

According to an embodiment, the protective member PF is disposed under the display module DM. The protective member PF includes functional layers that assist in driving the display module DM. For example, the protective member PF includes at least one of a support layer, an impact absorption layer, a heat dissipation layer, and a light blocking layer. The protective member PF supports bent configurations to alleviate stress when the display module DM is bent.

In FIG. 3, according to an embodiment, the electronic module EM, the power supply module PM, and the external case EDC are omitted for convenience of illustration. As shown in FIG. 3, a part of the display unit DU is assembled in a bent state. The display unit DU is bent with a predetermined radius of curvature with respect to the bending axis FX in the bendable region BR. The bending axis FX according to an embodiment extends in a first direction DR1.

In an electronic device ED according to an embodiment of the inventive concept, the window member WM and the antireflection member OP are combined by s first adhesive layer AM1. The antireflection member OP and the display module DM are coupled by a second adhesive layer AM2, and the display module DM and the protective member PF are coupled by a third adhesive layer AM3. The rear surfaces of the bendable driving control unit DCM and the display unit DU are coupled to a fourth adhesive layer AM4 disposed on a rear surface of the protective member PF. The adhesive layers AM1, AM2, AM3 and AM4 include an adhesive material. For example, the adhesive layer may be a pressure sensitive adhesive (PSA), an optical clear adhesive (OCA), or an optical clear resin (OCR). Further, it may include a photocurable adhesive material or a thermosetting adhesive material, and the materials thereof are not particularly limited.

According to an embodiment, the electronic device ED further includes a stress relief member disposed in the bendable region BR. The stress relief member is disposed in the bendable region BR where the width of the display unit DU is reduced. The stress relief member includes highly ductile organic materials. For example, the stress relief member includes synthetic resin. For example, the stress relief member includes at least one of acrylonitrile butadiene styrene copolymer (ABS), urethaneacrylate (UA), polyurethane (PU), polyethylene (PE), ethylene vinyl acetate (EVA), or polyvinyl chloride (PVC).

According to an embodiment, the protective member PF includes a first protective layer PF1, hereafter referred to as a support layer, a second protective layer PF2, hereinafter referred to as an impact absorption layer, and a third protective layer PF3, hereinafter referred to as a light blocking layer, disposed between the support layer PF1 and the impact absorption layer PF2. At least one of the support layer PF1, the impact absorption layer PF2, and the light blocking layer PF3 may be omitted. Alternatively, the stacking order along the third direction DR3 may be changed, and is not limited to any one embodiment.

According to an embodiment, the support layer PF1 includes a plastic film that includes one selected from a thermoplastic resin, such as polyethyeleneterepthalate (PET), polyethyelene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), or polymethyl methacrylate (PMMA), or a combination thereof. In particular, the support layer PF1 has excellent fatigue strength, excellent electrical characteristics, and excellent heat resistance by using polyethylene terephthalide (PET), and is not affected by temperature and humidity.

According to an embodiment, the impact absorption layer PF2 is a synthetic foam form. The impact absorption layer is a matrix layer containing a plurality of voids. The matrix layer includes a synthetic resin. For example, the synthetic resin includes at least one of acrylonitrile butadiene styrene copolymer (ABS), polyurethane (PU), polyethylene (PE), ethylene vinyl acetate (EVA), or polyvinyl chloride (PVC). The plurality of voids provide a porous structure that easily absorbs external impacts received by the electronic device ED.

According to an embodiment, the light blocking layer PF3 can handle effects of a configuration disposed on the rear surface of the display module DM through the active area AA. Therefore, light emitted from the display module DM to the rear surface is shielded.

According to an embodiment, the protective member PF further includes a heat dissipation layer. The heat dissipation layer effectively dissipates the heat generated by the display module DM. The heat dissipation layer includes at least one of graphite, copper (Cu), or aluminum (Al), all having good heat dissipation properties, but is not limited thereto. The heat dissipation layer not only improves heat dissipation of the display module DM, but can also shield and absorb electromagnetic fields.

The electronic device ED according to an embodiment of the inventive concept includes a protective member PF disposed under the display module DM, thereby improving the impact resistance and improving the light shielding effect. In addition, the electronic device ED has improved visibility and reliability with respect to external impacts or stress generated during use.

According to an embodiment, the electronic module EM includes a motherboard and various functional modules mounted on the motherboard that operates the electronic device ED. The motherboard is electrically connected to the display module DM through a connector. Here, the motherboard includes a rigid printed circuit board.

As shown in FIG. 4, according to an embodiment, the electronic device ED includes an electronic module EM, a power supply module PM, and a display device DD. The electronic module EM includes a control module 10, a wireless communication module 20, an image input module 30, a sound input module 40, a sound output module 50, a memory 60, an external interface 70, a light emitting module 80, a light receiving module 90, a camera module 100, etc. Some of the modules are not mounted on the motherboard, but can be electrically connected to the motherboard through a flexible circuit board.

According to an embodiment, the control module 10 controls the overall operation of the electronic device ED. The control module 10 is a microprocessor. For example, the control module 10 can activate or deactivate the display unit DU. The control module 10 controls the image input module 30, the sound input module 40, the sound output module 50, etc., based on the touch signal received from the display unit DU.

According to an embodiment, the wireless communication module 20 transmits/receives wireless signals to/from another terminal using a Bluetooth or a Wi-Fi line. The wireless communication module 20 can transmit/receive a voice signal using a general communication line. The wireless communication module 20 includes a transmission unit 22 that modulates and transmitting a signal to be transmitted, and a reception unit 24 that demodulates the received signal.

According to an embodiment, the image input module 30 processes the image signal and converts it into image data that can be displayed on the display device DD. The sound input module 40 receives an external sound signal by a microphone in a recording mode, a voice recognition mode, etc., and converts it into electrical voice data. The sound output module 50 converts the sound data received from the wireless communication module 20 or the sound data stored in the memory 60 into sound and outputs the sound.

According to an embodiment, the external interface 70 serves as an interface to an external charger, a wired/wireless data port, or a card socket such as a memory card, or a SIM/UIM card.

According to an embodiment, the light emitting module 80 generates and outputs light. The light emitting module 80 outputs infrared light. The light emitting module 80 includes an LED element. The light receiving module 90 detects infrared light. The light receiving module 90 is activated when infrared light of a predetermined frequency or higher is detected. The light receiving module 90 includes a CMOS sensor. After the infrared light generated by the light emitting module 80 is output, the infrared light is reflected by an external object, such as a user finger or a face, and the reflected infrared light is incident on the light receiving module 90. The camera module 100 captures an external image.

According to an embodiment, the power supply module PM supplies the power required for the overall operation of the electronic device ED. The power supply module PM includes a conventional battery module.

According to an embodiment, the external case EDC is coupled to the window member WM. The external case EDC provides the exterior surface of the electronic device ED with the window member WM. Although an external case EDC composed of a single body is shown, the external case EDC may include a plurality of bodies assembled with each other. The external case EDC may include a plurality of frames and/or plates made of glass, plastic, or metal.

Figure 5:
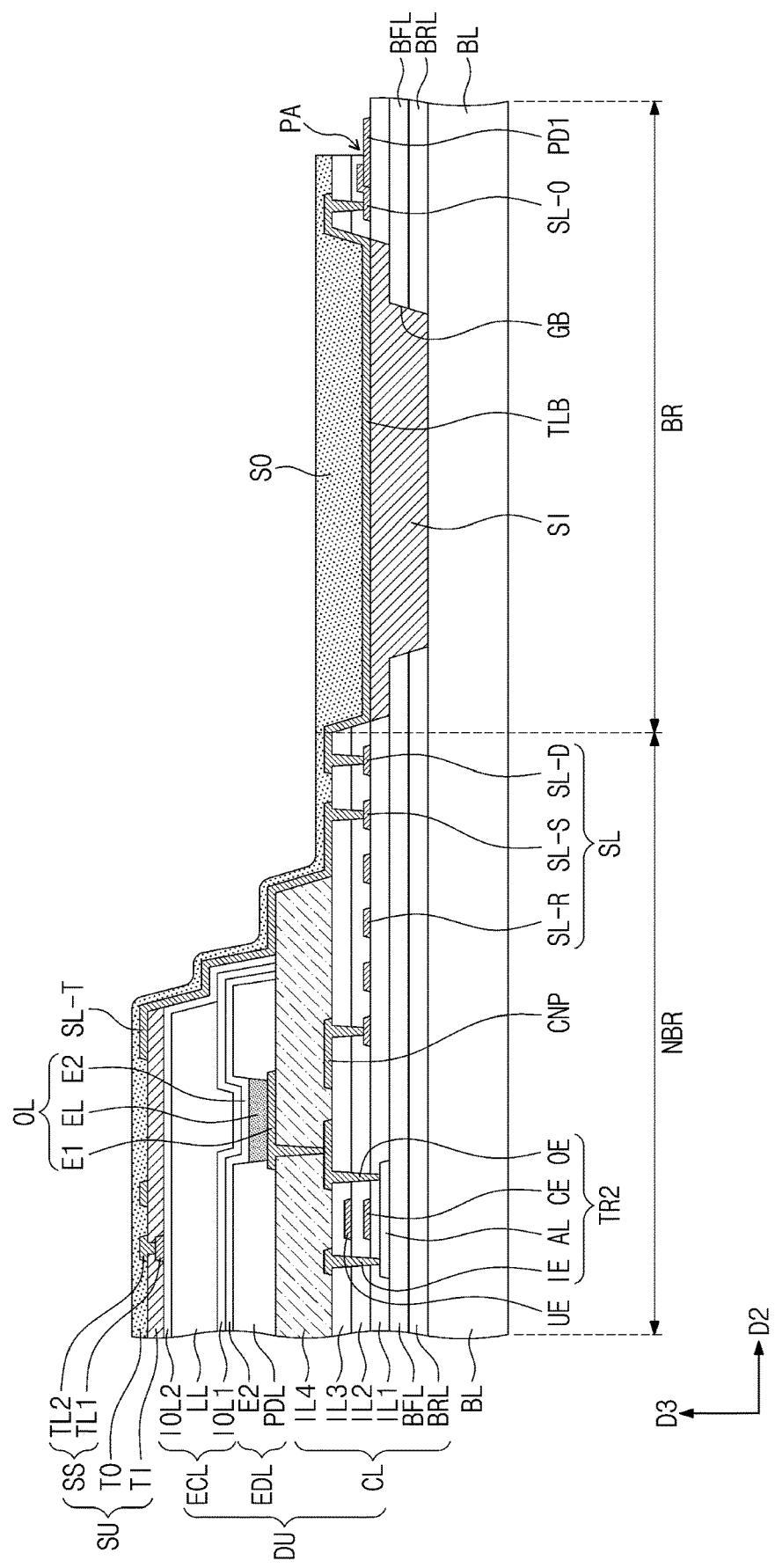
FIG. 5 is a cross-sectional view of a part of a bendable region and a non-bendable region.

FIG. 5 is a cross-sectional view of a part of a bendable region and a part of a non-bendable region, according to an embodiment. FIG. 5 shows a partial area where a non-bendable region NBR and a bendable region BR are connected. For convenience of illustration, the bendable region BR is shown in a relatively reduced size.

According to an embodiment, FIG. 5 is a cross-sectional view of an electronic device ED in which a display unit DU and an input sensing unit SU are coupled for easy illustration, and a part of the configuration is omitted. Moreover, like reference numerals refer to like elements throughout FIGS. 1A to 2B and overlapping descriptions are omitted.

According to an embodiment, the display unit DU includes a circuit element layer CL, a display element layer EDL, and a sealing layer ECL disposed on the base substrate BL. A groove GB, a connection wiring TLB, a first organic layer SI, and a second organic layer SO are disposed in the bendable region BR of the display unit DU.

According to an embodiment, the base substrate BL is a base layer on which the structures of the display unit DU are arranged. The base substrate BL is ductile. The base substrate BL includes a synthetic resin film. The synthetic resin layer includes a thermosetting resin. In particular, the synthetic resin layer is a polyimide-based resin layer, although the material thereof is not particularly limited. The synthetic resin layer includes at least one of an acrylic resin, a methacrylic resin, a polyisoprene, vinyl resin, an epoxy resin, a urethane resin, a cellulose resin, a siloxane-based resin, a polyamide-based resin, or a perylene resin. In addition, the base substrate may include a glass substrate, a metal substrate, or an organic/inorganic composite substrate.

According to an embodiment, the circuit element layer CL includes thin film transistors TR1 and TR2, connection patterns SL and a plurality of insulating layers BRL, BFL, IL2, IL3, and IL4. The display element layer EDL includes an organic light emitting element OL, and a pixel defining layer PDL.

According to an embodiment, the circuit element layer CL is disposed on the base substrate BL. The circuit element layer CL includes a driving circuit and a plurality of insulating layers. Specifically, the circuit element layer CL includes a first thin film transistor, a second thin film transistor TR2, a barrier layer BRL, a buffer layer BFL, and first to fourth insulating layers IL1, IL2, IL3, and IL4.

According to an embodiment, the barrier layer BRL covers the upper surface of the base substrate BL. The barrier layer BRL prevents foreign matter introduced through the base substrate BL from penetrating into the circuit element layer CL and the display element layer EDL. The barrier layer BRL includes at least one of silicon oxide ($SiO_2$) or silicon nitride ($SiN_X$).

According to an embodiment, the buffer layer BFL is disposed on the barrier layer BRL. The buffer layer BFL improves the coupling strength between the base substrate BL and the conductive patterns or semiconductor patterns. Conductive patterns and semiconductor patterns can be formed more stably on the buffer layer BFL than directly on the upper surface of the base substrate BL. The buffer layer BFL includes one of an organic material or an inorganic material. The buffer layer BFL includes at least one of silicon oxide ($SiO_2$) or silicon nitride ($SiN_X$). In some embodiments, at least one of the buffer layer BFL or the barrier layer BRL can be omitted.

According to an embodiment, the second thin film transistor TR2 includes a semiconductor layer AL, a control electrode CE, an input electrode IE, and an output electrode OE. The semiconductor layer AL includes a semiconductor material.

According to an embodiment, the semiconductor layer AL is disposed on the buffer layer BFL. The semiconductor layer AL includes at least one of a crystalline semiconductor material, an oxide semiconductor material, or an amorphous semiconductor material. For example, the semiconductor layer AL includes a polycrystalline semiconductor material such as polycrystalline silicon. The semiconductor layer AL is divided into an input region that includes an impurity, an output region, and a channel region disposed between the input region and the output region.

According to an embodiment, the control electrode CE is disposed between the second insulating layer IL2 and the first insulating layer IL1. The control electrode CE is spaced from the semiconductor layer AL with the first insulating layer IL1 therebetween. Each of input electrode IE and the output electrode OE is disposed between the third insulating layer IL3 and the fourth insulating layer IL4, and each of the input electrode IE and the output electrode OE is connected to the semiconductor layer AL through the first, second and third insulating layers IL1, IL2, and IL3.

According to an embodiment, the fourth insulating layer IL4 covers the input electrode IE and the output electrode OE and provides a flat surface. The fourth insulating layer IL4 includes an organic material.

In an embodiment, the display unit DU further includes an upper electrode UE disposed between the second insulating layer IL2 and the third insulating layer IL3. The upper electrode UE is spaced apart from the control electrode CE with the second insulating layer IL2 therebetween. The upper electrode UE functions in various configurations according to an applied electrical signal. For example, the upper electrode UE can be provided with the same electrical signal as the control electrode CE.

According to an embodiment, the second thin film transistor TR2 has a double gate structure that includes the upper electrode UE and the control electrode CE. In addition, the upper electrode UE may be provided with a different electrical signal than the control electrode CE. The upper electrode UE and the control electrode CE can function as a capacitor that forms a predetermined electric field. However, according to other embodiments of the inventive concept, the upper electrode UE may be omitted.

In an embodiment, the organic light emitting element OL is disposed on the circuit element layer CL. The organic light emitting element OL includes a first electrode E1, a light emitting layer EL, and a second electrode E2. The first electrode E1 is connected to the second thin film transistor TR2 and receives an electrical signal from the second thin film transistor TR2. The second electrode E2 is connected to a power terminal. The light emitting layer EL is exposed by an opening in the pixel defining layer PDL. The light emitting layer EL emits light in correspondence with a potential difference between the first electrode E1 and the second electrode E2.

According to an embodiment, the sealing layer ECL includes a first inorganic layer IOL1, a second inorganic layer IOL2, and an organic layer LL. The first inorganic layer IOL1 covers the organic light emitting element OL. The organic layer LL is disposed between the first inorganic layer IOL1 and the second inorganic layer IOL2. The organic layer LL provides a flat upper surface for the second inorganic layer IOL2. The second inorganic layer IOL2 covers the organic layer LL. At least a part of the first inorganic layer IOL1 is exposed by the organic layer LL and directly contacts the second inorganic layer IOL2.

According to an embodiment, the input sensing unit SU is disposed directly on the sealing layer ECL. That is, the input sensing unit SU is formed on the upper surface of the sealing layer ECL through deposition or patterning. However, this is illustrated by way of example, and the electronic device ED may further include other members, such as color filters or buffer layers interposed between the input sensing unit SU and the sealing layer ECL. The input sensing unit SU includes a detection pattern SS, a first detection insulating layer TI, and a second detection insulating layer TO.

According to an embodiment of the inventive concept, the detection pattern SS and the first detection insulating layer TI are disposed on the sealing layer ECL. The second detection insulating layer TO is disposed on the first detection insulating layer TI. The detection pattern SS includes a first detection pattern TL1 and a second detection pattern TL2. The first detection pattern TL1 is disposed between the sealing layer ECL and the first detection insulating layer TI. The second detection pattern TL2 is disposed on the first detection insulating layer TI and under the second detection insulating layer TO. In an embodiment, the first detection pattern TL1 is shown as a bridge pattern connected to the second detection pattern TL2, but embodiments of the inventive concept are not limited thereto.

According to an embodiment, the detection patterns TL1 and TL2 are part of the mesh lines formed by the detection electrodes TE1 and TE2 shown in FIG. 2B.

According to an embodiment the detection patterns TL1 and TL2 include at least one of a metal, a conductive polymer, a metal nanowire, or a graphene. Alternatively, the detection patterns TL1 and TL2 include a transparent conducting oxide (TCO). For example, the detection patterns TL1 and TL2 include at least one of transparent conductive oxide (TCO), indium tin oxide (ITO), indium zinc oxide (IZO), zinc oxide (ZnO), carbon nanotube (CNT), or graphene. The first detection insulating layer TI and the second detection insulating layer TO include organic materials.

According to an embodiment, a groove GB is formed in some of the insulating layers in the display unit DU. The groove GB is formed by removing a part of each of the insulating layers that overlap the bendable region BR, and exposes a part of the base substrate BL.

According to an embodiment, the groove GB includes surfaces exposed by removing a part of each of the barrier layer BRL, the buffer layer BFL, and the first to third insulating layers IL1, IL2, and IL3.

According to an embodiment, the first organic layer SI, the connection wiring TLB, and the second organic layer SO are disposed in the bendable region BR. The connection wiring TLB is disposed between the first organic layer SI and the second organic layer SO.

According to an embodiment, the first organic layer SI covers a part of the exposed base substrate BL and the groove GB. The first organic layer SI includes an organic material. The first organic layer SI includes the same material as the first detection insulating layer TI. Therefore, the first organic layer SI and the first detection insulating layer TI can be formed by a same process.

According to an embodiment, by forming the groove GB in the bendable region BR and filling the groove GB with the first highly flexible organic layer SI, bending stress on the bendable region BR can be alleviated and reliability of the electronic device ED can be improved.

In an embodiment, the connection patterns SL are disposed on the first insulating layer IL1. The connection patterns SL include a first pattern SL-R, a second pattern SL-S, a third pattern SL-D, and a fourth pattern SL-O.

According to an embodiment, the connection patterns SL are connected to at least one of signal lines and connection wirings TLB in the non-bendable region NBR.

For example, according to an embodiment, the first pattern SL-R of the connection patterns SL is connected to any one of the signal lines connected to the pixel PX. The first pattern SL-R is also be connected to a signal line on another layer through a bridge pattern CNP.

According to an embodiment, the second pattern SL-S is connected to the input detection wiring SL-T that branches from at least at one of signal lines in the input sensing unit SU in the non-bendable region NBR.

According to an embodiment, the third pattern SL-D is connected to the data line DL shown in FIG. 2A.

According to an embodiment, at least one of the connection patterns SL is connected to a connection wiring TLB. The connection patterns SL are connected to the pads PD1 and PD2 through a connection wiring TLB to receive electrical signals.

In an embodiment, the third pattern SL-D and the connection wiring TLB are connected. Accordingly, the data line DL is connected to the driving control unit DCM through the pad PD1 connected to the connection wiring TLB. Therefore, the pixel PX can receive the data signal received from the driving control unit DCM. However, embodiments are not limited thereto, and the connection wiring TLB may be connected to the first pattern SL-R and the second pattern SL-S, and through this, receive the data signal transmitted from the driving control unit DCM.

According to an embodiment, the connection wiring TLB overlaps at least a part of the bendable region BR. The connection wiring TLB is disposed on the first organic layer SI. One end of the connection wiring TLB is connected to the third line SL-D in the non-bendable region NBR, and the other end of the connection wiring TLB is connected to the fourth line SL-O disposed in the bendable region BR. The fourth line SL-O is connected to the pads PD1 and PD2 to which the driving control unit DCM is connected. Therefore, the display unit DU and input sensing unit SU are electrically connected to the driving control unit DCM through the connection wiring TLB that overlaps the bendable region BR.

According to an embodiment, the connection wiring TLB includes the same material as the first detection pattern TL1 and the second detection pattern TL2. Therefore, the connection wiring TLB and the first and second detection patterns TL1 and TL2 can be formed by the same process.

According to an embodiment, the second organic layer SO covers the connection wiring TBL. The second organic layer SO includes the same material as the second detection insulating layer TO. Therefore, the second organic layer SO and the second detection insulating layer TO can be formed by the same process. Although FIG. 5 shows the second organic insulating layer SO in the bendable region BR and the non-bendable region NBR for convenience of illustration, in other embodiments, the second organic layer SO may have a substantially uniform shape that extends from the second detection insulating layer TO.

In an electronic device ED according to an embodiment of the inventive concept, the configuration disposed in the groove GB in the bendable region BR can be formed simultaneously with the same process as the configuration of the input sensing unit SU to have the same materials. Accordingly, the cost and time of the electronic device manufacturing process can be reduced.

Figure 6:
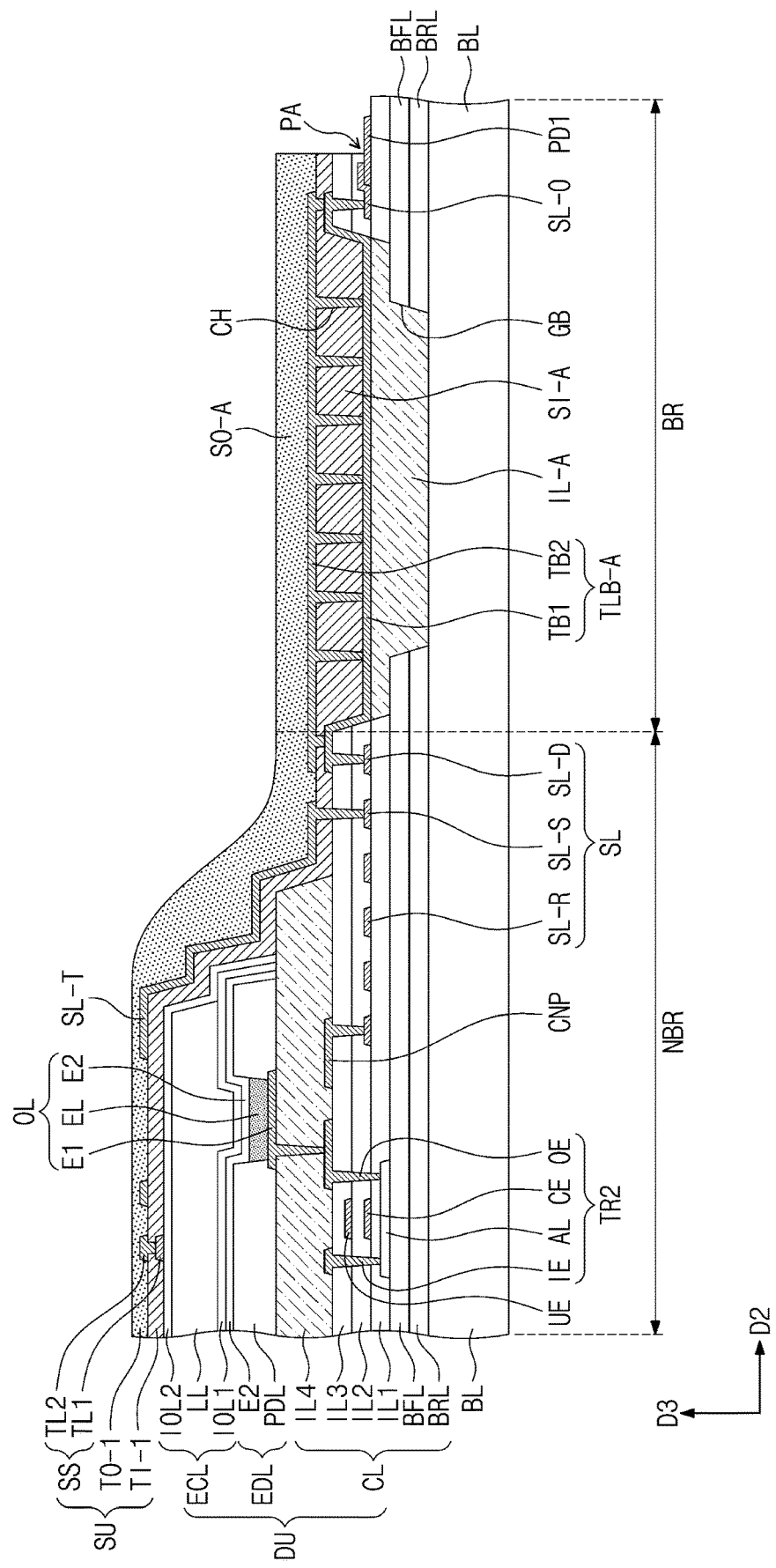
FIG. 6 is a cross-sectional view of a part of an electronic device according to an embodiment of the inventive concept.
Figure 7:
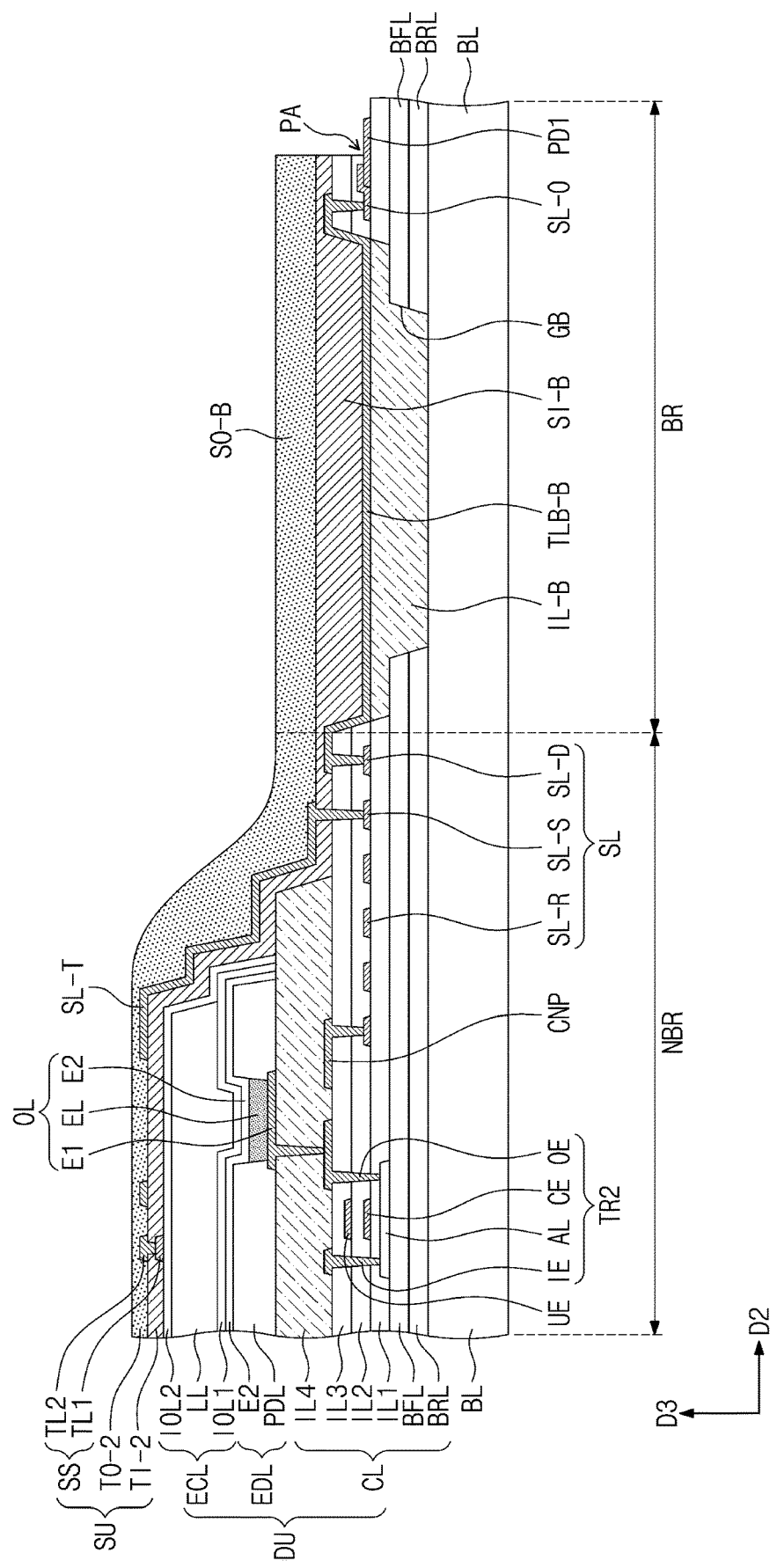
FIG. 7 is a cross-sectional view of a part of an electronic device according to an embodiment of the inventive concept.
Figure 8:
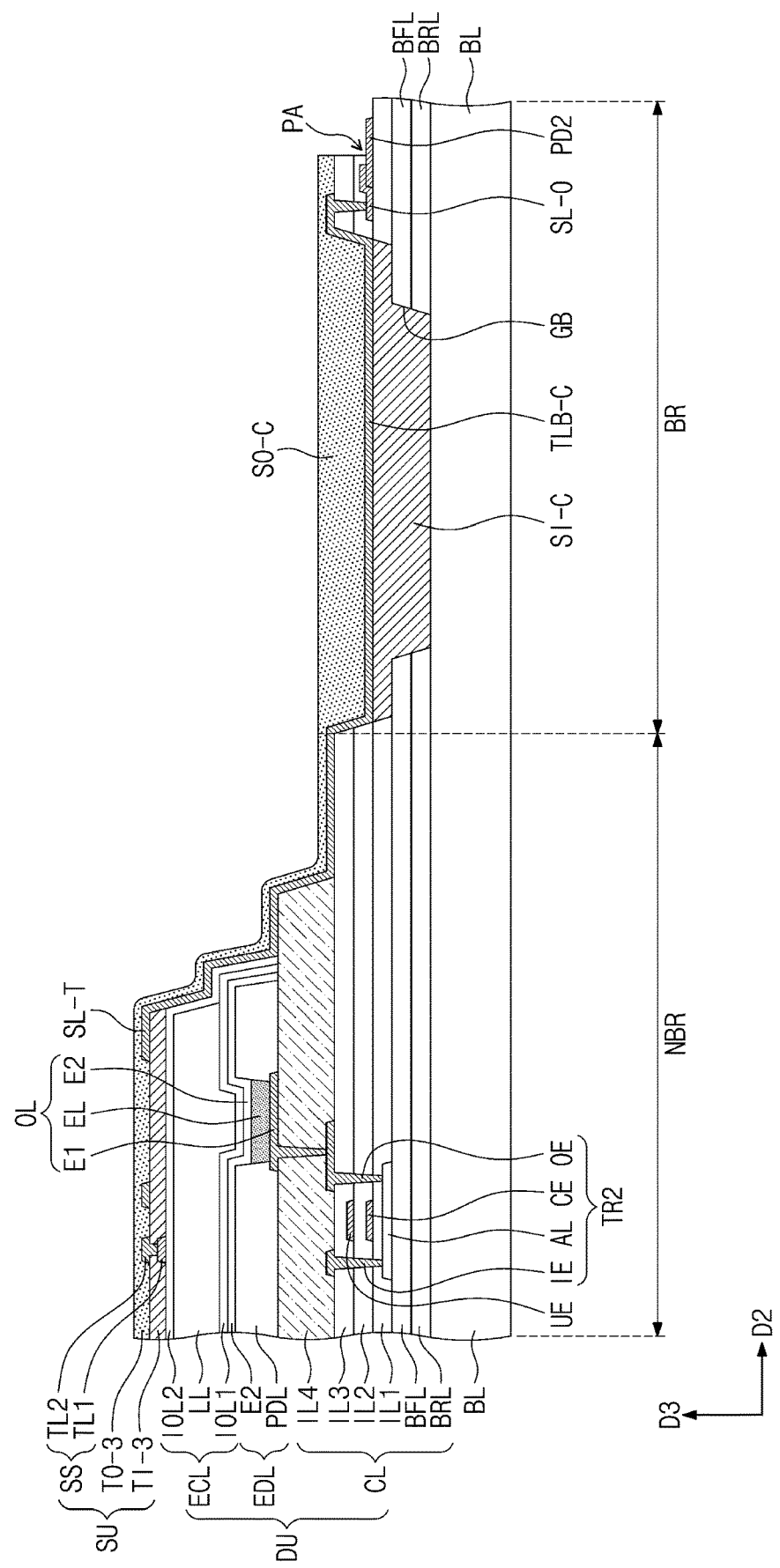
FIG. 8 is a cross-sectional view of a part of an electronic device according to an embodiment of the inventive concept.

FIG. 6 is a cross-sectional view of a part of an electronic device according to an embodiment of the inventive concept. FIG. 7 is a cross-sectional view of a part of an electronic device according to an embodiment of the inventive concept. FIG. 8 is a cross-sectional view of a part of an electronic device according to an embodiment of the inventive concept. Like reference numerals refer to like elements in FIGS. 1A to 5 and overlapping descriptions are omitted.

Referring to FIG. 6, according to an embodiment, unlike the first organic layer SI of FIG. 5, the first organic layer IL-A includes the same material as at least one of the insulating layers IL1, IL2, IL3, and IL4 in the circuit element layer CL. For example, the first organic layer IL-A includes the same material as the fourth insulating layer IL4 that covers the input electrode IE and the output electrode OE. Therefore, the first organic layer IL-A and the fourth insulating layer IL4 can be formed by the same process.

According to an embodiment, the electronic device further includes an additional organic layer SI-A disposed between the first organic layer IL-A and the second organic layer SO-A. The second organic layer SO-A includes the same material as the second detection insulating layer TO. The additional organic layer SI-A includes the same material as the first detection insulating layer TI. Therefore, the additional organic layer SI-A and the first detection insulating layer TI can be formed by the same process.

According to an embodiment, the connection wiring TLB-A is disposed on the first organic layer IL-A. The connection wiring TLB-A includes a first wiring TB1 and a second wiring TB.

According to an embodiment, the first wiring TB1 is disposed between the first organic layer IL-A and the additional organic layer SI-A. The second wiring TB-2 is disposed between the additional organic layer SI-A and the second organic layer SO-A. The second wiring TB2 penetrates the additional organic layer SI-A and is connected to the first wiring TB1 through the contact hole CH.

According to an embodiment, the first wiring TB1 is formed by the same process as the first detection pattern TL1, and the second wiring TB2 is formed by the same process as the second detection pattern TL2.

According to an embodiment, the connection wiring TLB-A disposed in the bendable region BR includes wiring TB1 and TB2 disposed on different layers and connected to each other, such that the contact resistance between the connection wiring TLB-A and the electrically connected configuration can be reduced and the reliability of the electrical connection may be improved.

Referring to FIG. 7, according to an embodiment, unlike FIG. 6, a single layer of connection wiring TLB-B is disposed on the first organic layer IL-B. An additional organic layer SI-B is disposed on the connection wiring TLB-B, and a second organic layer SO-B is disposed on the additional organic layer SI-B. The connection wiring TLB-B can be formed by the same process as the second detection pattern TL2.

Referring to FIG. 8, according to an embodiment, an input sensing unit SU is connected to a connection wiring TLB-C. The input sensing unit SU is connected to the connection wiring TLB-C through the input detection wiring SL-T. Unlike the input detection wiring SL-T shown in FIG. 5, the input detection wiring SL-T shown in FIG. 8 extends to a non-bendable region NBR to be integrally formed with connection wiring TLB-C.

According to an embodiment, the input sensing unit SU is connected to the second pad PD2 through the connection wiring TLB-C. Since the second pad PD2 is connected to the driving control unit DCM, the driving control unit DCM can control the display unit DU and the input sensing unit SU through a single pad area PA.

Accordingly, in an embodiment, a separate space for forming the pad on the input sensing unit SU is omitted, and since the sensing range is widened, an input sensing unit SU having an improved sensing function can be provided.

FIGS. 9A to 9E are cross-sectional views that illustrate a method of manufacturing an electronic device according to an embodiment of the inventive concept. Like reference numerals may refer to like elements in FIGS. 1A to 5 and overlapping descriptions are omitted. Hereinafter, an electronic device manufacturing method according to an embodiment of the inventive concept will be described with reference to FIGS. 9A to 9E.

Figure 9A:
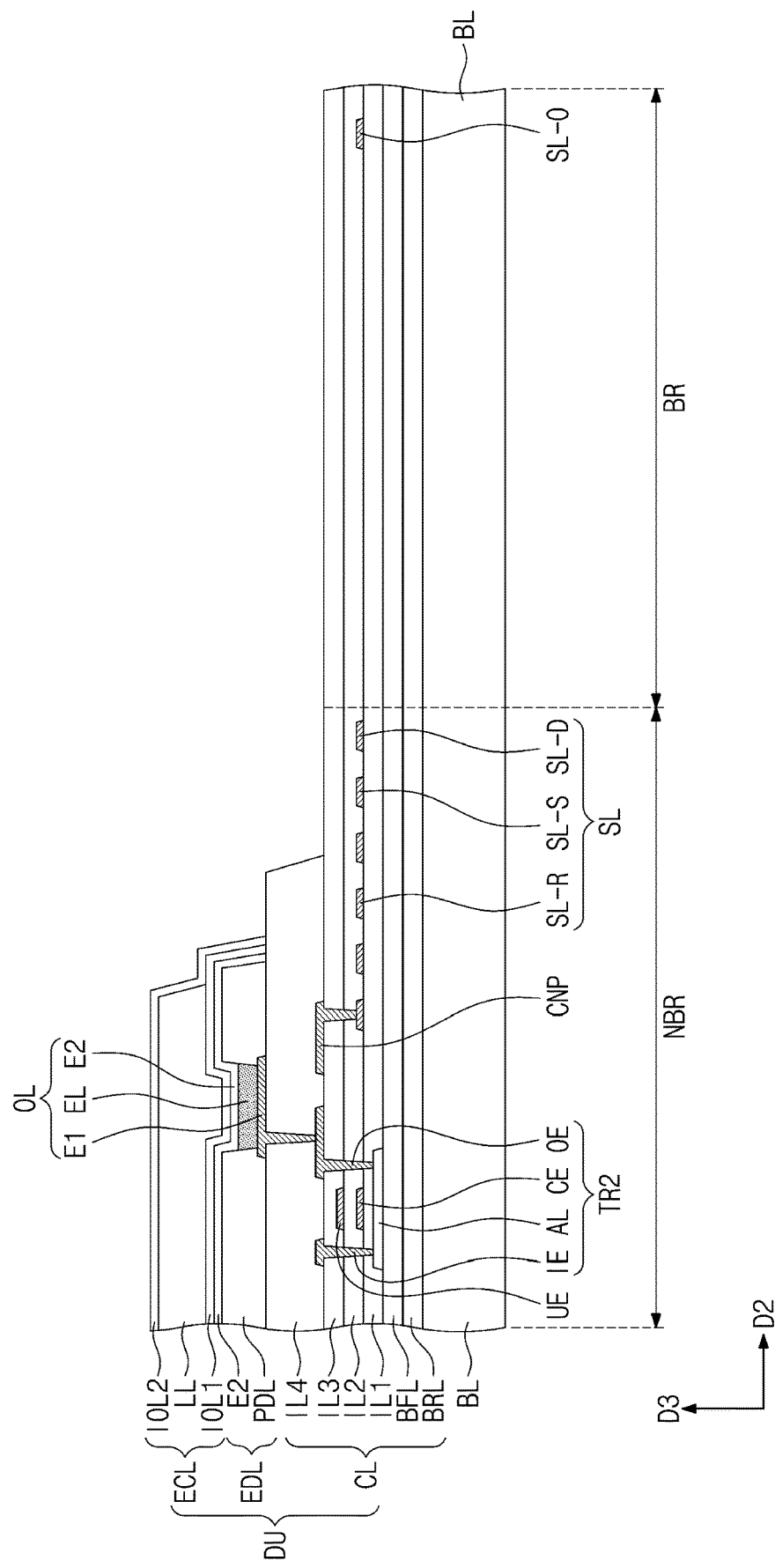
FIGS. 9A to 9E are cross-sectional views that illustrate a method of manufacturing an electronic device according to an embodiment of the inventive concept.

Referring to FIG. 9A, according to an embodiment, an electronic device manufacturing method includes providing a preliminary display unit. Forming the preliminary display unit includes forming a barrier layer BRL and a buffer layer BFL by depositing, coating, or printing an inorganic material on a non-bendable region NBR of a base substrate BL. Thereafter, the semiconductor layer AL is formed on the buffer layer BFL. Then, the first insulating layer IL1 that covers the semiconductor layer AL is formed by deposition, coating, or printing. The insulating layers disposed on the first insulating layer IL1 are also formed by deposition, coating, or printing.

Then, according to an embodiment, a control electrode CE and connection patterns SL are formed on the first insulating layer IL1. The control electrode CE and the connection patterns SL are formed by forming a conductive layer on the first insulating layer IL1 and then patterning the conductive layer. Thereafter, the semiconductor layer AL is doped using the control electrode CE as a mask. The region, i.e., the channel region, of the semiconductor layer AL that overlaps the control electrode CE in the semiconductor layer AL is undoped, and both side regions, i.e., the input region and output region, of the channel region are doped. In an embodiment, doping is performed by using an n-type dopant, that is, a pentavalent element. Then, a second insulating layer IL2 is formed to cover the control electrode CE on the non-bendable region NBR and on the bendable region BR of the first insulating layer IL1. An upper electrode UE is formed on the second insulating layer IL2. Then, a third insulating layer IL3 is formed that covers the upper electrode UE on the non-bendable region NBR and on the bendable region BR of the second insulating layer IL2.

According to an embodiment, the input electrode IE, the output electrode OE, and the bridge pattern CNP are formed on the third insulating layer IL3. The input electrode IE, the output electrode OE, and the bridge pattern CNP are formed by forming a conductive layer on the third insulating layer IL3 and then patterning the conductive layer. The input electrode IE and the output electrode OE are connected to the semiconductor layer AL through the first to third insulating layers IL1, IL2, and IL3. The bridge pattern CNP is connected to the connection patterns SL through the second and third insulating layers IL2 and IL3. Thereafter, a fourth insulating layer IL4 is formed that covers the input electrode IE, the output electrode OE, and the bridge pattern CNP.

Then, according to an embodiment, an organic light emitting element OL is formed on the fourth insulating layer IL4. A first electrode E1 is formed on the fourth insulating layer to be connected to the output electrode OE by penetrating the fourth insulating layer IL4. Thereafter, a pixel defining layer PDL that exposes the center portion of the first electrode E1 is formed on the fourth insulating layer IL4.

Then, a hole control layer, a light emitting layer EL, an electron control layer, and a second electrode E2 are sequentially formed on the pixel defining layer PDL. The light emitting layer EL overlaps a part of the first electrode E1 exposed by the pixel defining layer PDL.

Then, according to an embodiment, a sealing layer ECL is formed on the second electrode E2. The sealing organic layer LL and the sealing inorganic layers IOL1 and IOL2 are formed by deposition and ink jet printing processes, etc. The sealing layer ECL is formed on the non-bendable region NBR and not on the bendable region BR.

Figure 9B:
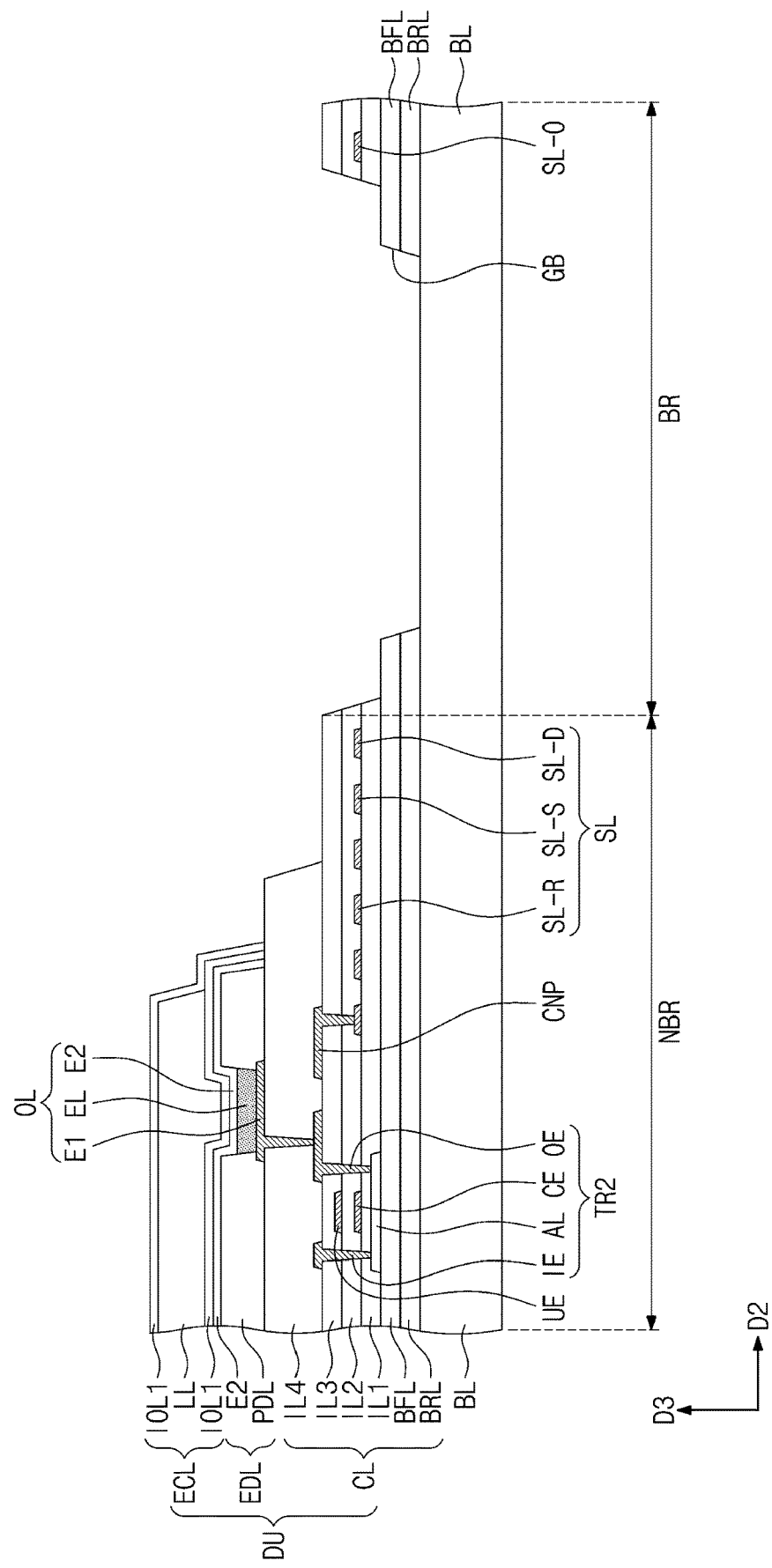

Thereafter, referring to FIG. 9B, according to an embodiment, a groove is formed. The groove GB is formed by removing a part of the barrier, buffer and insulating layers BRL, BFL, IL1, IL2, and IL3 to expose a part of the base substrate BL in the bendable region BR. The groove GB is formed by using a mask and an etching gas or by using a laser beam. In forming the groove, a step is formed between the inorganic layers BRL and BFL and the insulating layers IL2 and IL3 that exposes a part of the upper surface of the buffer layer BFL.

Figure 9C:
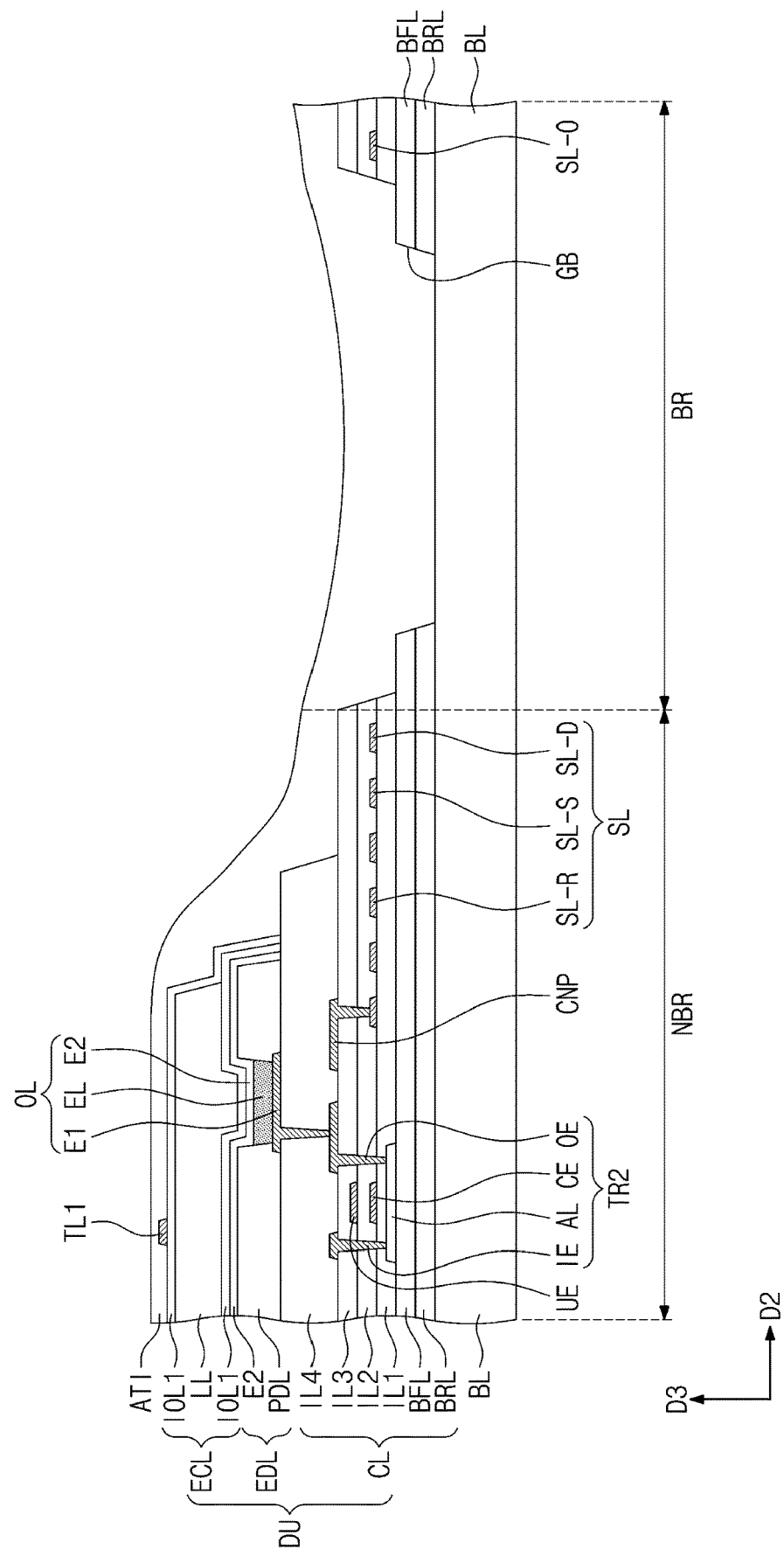

Thereafter, referring to FIG. 9C, according to an embodiment, a first detection pattern is formed. The first detection pattern TL1 is disposed on the sealing layer ECL. The first detection pattern TL1 is a part of the mesh line that constitutes the first connection patterns BP1 of the first detection electrode TE1 shown in FIG. 2B. The first detection pattern TL1 is formed by forming a conductive layer on a sealing layer ECL and then patterning the conductive layer.

Then, according to an embodiment, a preliminary organic layer ATI is formed. The preliminary organic layer ATI covers the first detection pattern TL1 disposed in the non-bendable region NBR and the exposed base substrate BL in the groove GB of the bendable region BR. The preliminary organic layer ATI includes an organic material.

Figure 9D:
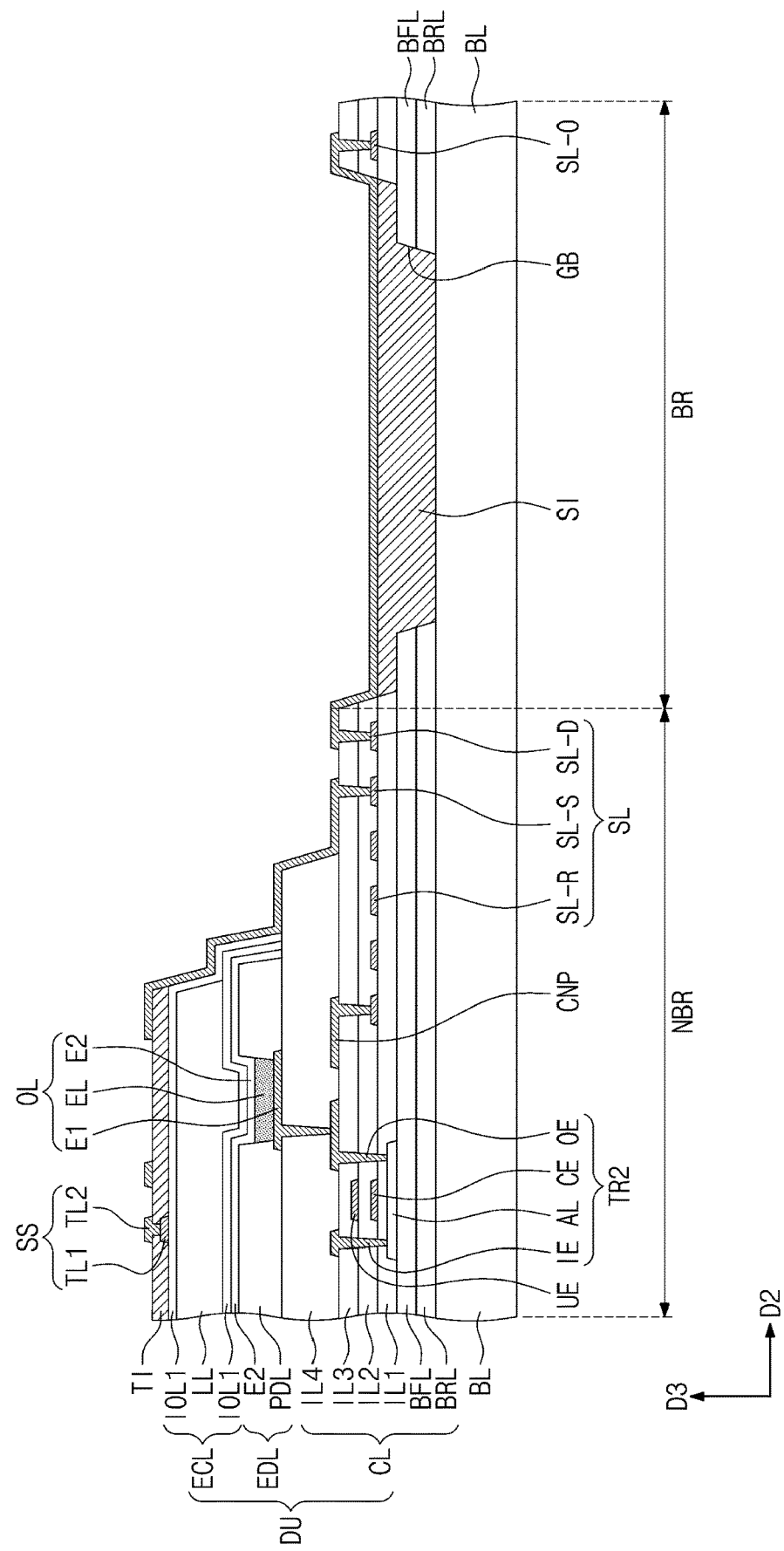

Next, referring to FIG. 9D, according to an embodiment, by patterning the preliminary organic layer ATI, a first detection insulating layer TI disposed on the sealing layer ECL and a first organic layer SI that covers the exposed base substrate BL in the groove GB are formed.

Then, according to an embodiment, a second detection pattern TL2 and a connection wiring are formed. The second detection pattern TL2 is a part of the mesh line that constitutes the first sensor patterns SP1 of the first detection electrode TE1 shown in FIG. 2B, the second sensor patterns SP2 of the second detection electrode TE2, and the second connection patterns BP2. The second detection pattern TL2 is formed by forming a conductive layer on the first detection insulating layer TI and then patterning the conductive layer. The connection wiring TLB is formed by forming a conductive layer on the first organic layer SI and then patterning the conductive layer.

Figure 9E:
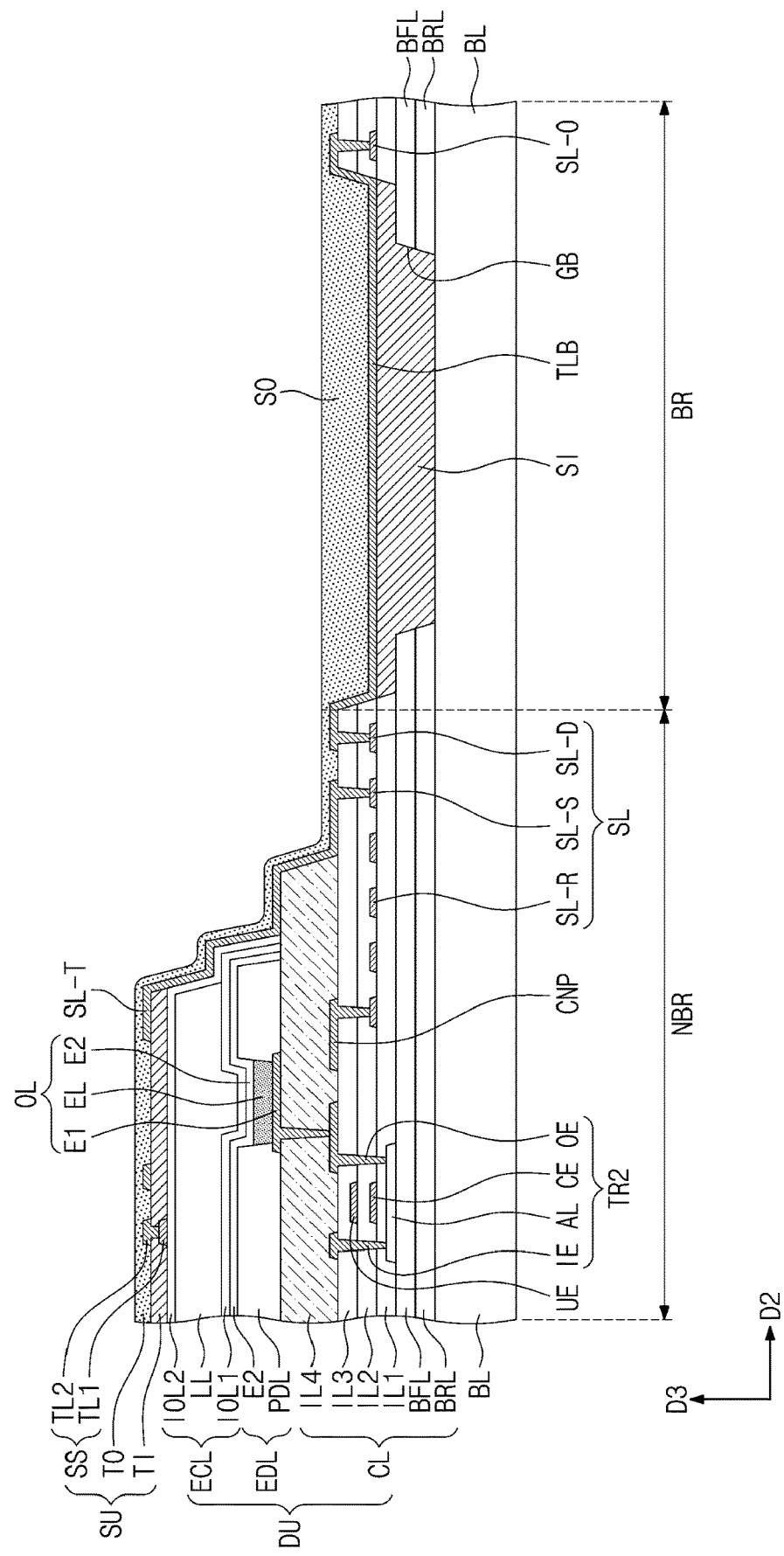

Thereafter, referring to FIG. 9E, according to an embodiment, a second organic layer SO and a second detection insulating layer TO are formed. The second detection insulating layer TO covers the second detection pattern TL2 and the second organic layer SO covers the connection wiring TLB. The second organic layer SO and the detection insulating layer TO include an organic material.

In an electronic device ED according to an embodiment of the inventive concept, the configuration disposed in the groove GB in the bendable region BR can be formed simultaneously with the same process as the configuration of the input sensing unit SU to have the same materials. Accordingly, the cost and time of the electronic device manufacturing process can be reduced, and the number of masks for filling the organic material in the bendable region BR can be reduced.

Although exemplary embodiments of the inventive concept have been described, it is understood that embodiments of the inventive concept should not be limited to disclosed exemplary embodiments but various changes and modifications may be made by one ordinary skilled in the art within the spirit and scope of the inventive concept as hereinafter claimed.

What is claimed is:

1. An electronic, device comprising:
a base substrate that includes a bendable region capable of being bent about a bending axis that extends along one direction and a non-bendable region adjacent to the bendable region;
a display unit disposed on the base substrate and that includes
a circuit element layer that includes a thin film transistor and a plurality of insulating layers,
a display element layer that includes an organic light emitting element connected to the thin film transistor,
a sealing layer that covers the display element layer, and a
groove formed through some of the insulating layers in the bendable region that exposes a part of the base substrate in the bendable region;
an input sensing unit disposed on the sealing layer and that includes
a first detection insulating layer disposed on the sealing layer,
a first detection pattern disposed on the sealing layer and covered by the first detection insulating layer,
a second detection pattern disposed on the first detection insulating layer,
a first organic layer in the bendable region that covers a part of the exposed base substrate and the groove;
a connection wiring in the bendable region disposed on the first organic layer and connected to at least one of the display unit and the input sensing unit and that includes a same material as at least one of the first and second detection patterns; and
a second organic layer that covers the connection wiring in the bendable region,
wherein the first organic layer and the connection wiring overlap each other in the bendable region.

2. The electronic device of claim 1, wherein the second detection pattern overlaps the first detection pattern and is connected to the first detection pattern and a second detection insulating layer that covers the first detection insulating layer and the second detection pattern.

3. The electronic device of claim 1, wherein
the first organic layer comprises a same material as the first detection insulating layer, and
the second organic layer comprises a same material as the second detection insulating layer.

4. The electronic device of claim 1, wherein the first organic layer comprises a same material as any one of the insulating layers.

5. The electronic device of claim 1, wherein the second organic layer comprises a same material as the first detection insulating layer.

6. The electronic device of claim 1, further comprising an additional organic layer disposed in the bendable region between the first organic layer and the second organic layer and that includes a same material as the first detection insulating layer,
wherein the second organic layer includes a same material as the second detection insulating layer.

7. The electronic device of claim 6, wherein the connection wiring comprises
a first wiring disposed in the bendable region between the first organic layer and the additional organic layer, and
a second wiring disposed in the bendable region between the additional organic layer and the second organic layer,
wherein the second wiring is connected to the first wiring through a contact hole that penetrates the additional organic layer.

8. The electronic device of claim 1, wherein the connection wiring is disposed between the first organic layer and the second organic layer.

9. The electronic device of claim 1, wherein the thin film transistor comprises
a semiconductor pattern,
a control electrode spaced apart from the semiconductor pattern,
an upper electrode spaced apart from the control electrode,
an input electrode connected to the semiconductor pattern, and
an output electrode disposed on the same layer as the input electrode and connected to the semiconductor pattern,
wherein the semiconductor pattern comprises at least one of an oxide semiconductor pattern or a silicon semiconductor pattern.

10. The electronic device of claim 9, wherein the insulating layers comprise:
at least one inorganic layer disposed between the base substrate and the semiconductor pattern;
a first insulating layer that covers the semiconductor pattern;
a second insulating layer that covers the control electrode and the first insulating layer,
a third insulating layer that covers the upper electrode and the second insulating layer; and
a fourth insulating layer that covers the third insulating layer, the input electrode, and the output electrode,
wherein the first organic layer comprises a same material as the fourth insulating layer.

11. The electronic device of claim 1, further comprising a pad area in the bendable region that includes a pad exposed by some of the insulating layers that overlap the bendable region, wherein the pad is connected to the connection wiring.

12. The electronic device of claim 11, further comprising a circuit board connected to the pad.

13. An electronic device, comprising:
a base substrate that includes a bendable region capable of being bent about a bending axis that extends along one direction and a non-bendable region adjacent to the bendable region;
a display unit that includes
a pixel disposed on the base substrate and that includes a thin film transistor,
an organic light emitting element connected to the thin film transistor, and
a plurality of insulating layers;
an input sensing unit disposed on the pixel, and that includes
a first detection pattern disposed on the pixel, a first detection insulating layer disposed on the pixel and that covers the first detection pattern, a second detection pattern disposed on the first detection insulating layer, wherein the second detection pattern overlaps and is connected to the first detection pattern, and a second detection insulating layer that covers the first detection insulating layer and the second detection pattern;

a groove formed through the insulating layers in the bendable region that exposes a part of the base substrate in the bendable region and that extends along the bending axis;

a first organic layer in the bendable region that covers a part of the exposed base substrate and the groove;

a connection wiring connected to the pixel through the bendable region; and a second organic layer in the bendable region and that covers the connection wiring, wherein the second organic layer comprises a same material as the second detection insulating layer.

14. The electronic device of claim 13, wherein the connection wiring comprises a same material as at least one of the first and second detection patterns.

15. The electronic device of claim 13, wherein the first organic layer comprises a same material as the first detection insulating layer.

16. The electronic device of claim 13, wherein the connection wiring is disposed on the first organic layer.

17. The electronic device of claim 13, wherein the first organic layer comprises a same material as at least one of the insulating layers.

18. The electronic device of claim 13, further comprising an additional organic layer disposed in the bendable region between the first organic layer and the second organic layer and that includes a same material as the first detection insulating layer, wherein the connection wiring comprises a first wiring disposed in the bendable region between the first organic layer and the additional organic layer, and a second wiring disposed in the bendable region between the additional organic layer and the second organic layer, wherein the second wiring is connected to the first wiring through a contact hole that penetrates the additional organic layer.

19. The electronic device of claim 18, wherein the first wiring comprises a same material as the first detection pattern and the second wiring comprises a same material as the second detection pattern.

20. A method of manufacturing an electronic device, comprising the steps of:

forming, through a deposition process, a preliminary display unit that includes a base substrate that includes a bendable region capable of being bent about a bending axis that extends along one direction and a non-bendable region adjacent to the bendable region, a thin film transistor on the base substrate, an organic light emitting device connected to the thin film transistor, a sealing layer that covers the organic light emitting device, and a plurality of insulating layers;

forming a groove by removing a part of each of the insulating layers to expose a part of the base substrate in the bendable region;

forming a first detection pattern by forming a first conductive layer on the sealing layer and patterning the first conductive layer;

forming a preliminary organic layer that covers the first detection pattern, a part of the exposed base substrate in the bendable region, and the groove in the bendable region;

forming a first detection insulating layer that covers the first detection pattern and a first organic layer in the bendable region that covers a part of the exposed portion of the base substrate and the groove by patterning the preliminary organic layer;

forming a second detection pattern and a connection wiring by forming a second conductive layer on the first detection insulating layer and the bendable region and patterning the second conductive layer, wherein the second detection overlaps the first detection pattern and is connected to the first detection pattern and forming a second organic layer in the bendable region that covers the second detection pattern and the connection wiring.

* * * * *